US011966043B2

(12) United States Patent
Kono

(10) Patent No.: US 11,966,043 B2
(45) Date of Patent: Apr. 23, 2024

(54) IMAGING OPTICAL SYSTEM, EXPOSURE APPARATUS, AND ARTICLE MANUFACTURING METHOD

(71) Applicant: CANON KABUSHIKI KAISHA, Tokyo (JP)

(72) Inventor: Michio Kono, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 296 days.

(21) Appl. No.: 17/370,199

(22) Filed: Jul. 8, 2021

(65) Prior Publication Data

US 2022/0011571 A1 Jan. 13, 2022

(30) Foreign Application Priority Data

Jul. 10, 2020 (JP) ................................ 2020-119449

(51) Int. Cl.
*G03F 7/20* (2006.01)
*G02B 27/00* (2006.01)

(52) U.S. Cl.
CPC ....... *G02B 27/0043* (2013.01); *G03F 7/2008* (2013.01)

(58) Field of Classification Search
CPC ............. G02B 17/0808; G02B 17/08; G02B 27/0043; G03F 7/2008; G03F 7/70266; G03F 7/70233; G03F 7/70316; G03F 7/70225; G03F 7/70308
See application file for complete search history.

(56) References Cited

U.S. PATENT DOCUMENTS

| | | | | |
|---|---|---|---|---|
| 4,688,904 A * | 8/1987 | Hirose | ............... | G02B 17/0892 359/729 |
| 10,884,236 B2 | 1/2021 | Sai | | |
| 2006/0092393 A1* | 5/2006 | Harned | ............. | G03F 7/70266 355/53 |
| 2009/0042139 A1* | 2/2009 | Shiraishi | ............. | G03F 7/70425 430/311 |
| 2019/0041631 A1* | 2/2019 | Sai | ......................... | G03B 21/28 |

FOREIGN PATENT DOCUMENTS

| | | |
|---|---|---|
| JP | 3724517 B2 | 12/2005 |
| JP | 2017211493 A | 11/2017 |
| JP | 2019028352 A | 2/2019 |

* cited by examiner

*Primary Examiner* — Peter B Kim
(74) *Attorney, Agent, or Firm* — ROSSI, KIMMS & McDOWELL LLP

(57) ABSTRACT

An imaging optical system comprises adjusters for adjusting a shape of each of at least two reflecting surfaces by applying a force to a rear surface of each of the reflecting surfaces. Points obtained by projecting force acting points of the adjusters in an optical axis direction defined with respect to the reflecting surface are defined as correction points, the acting points are set such that, when first and second rays in a light flux emitted from one point on the object plane are reflected by first and second reflecting surfaces, the first ray strikes the correction point of the first reflecting surface but does not strike the correction point of the second reflecting surface, and the second ray does not strike the correction point of the first reflecting surface but strikes the correction point of the second reflecting surface.

9 Claims, 26 Drawing Sheets

FIG. 1
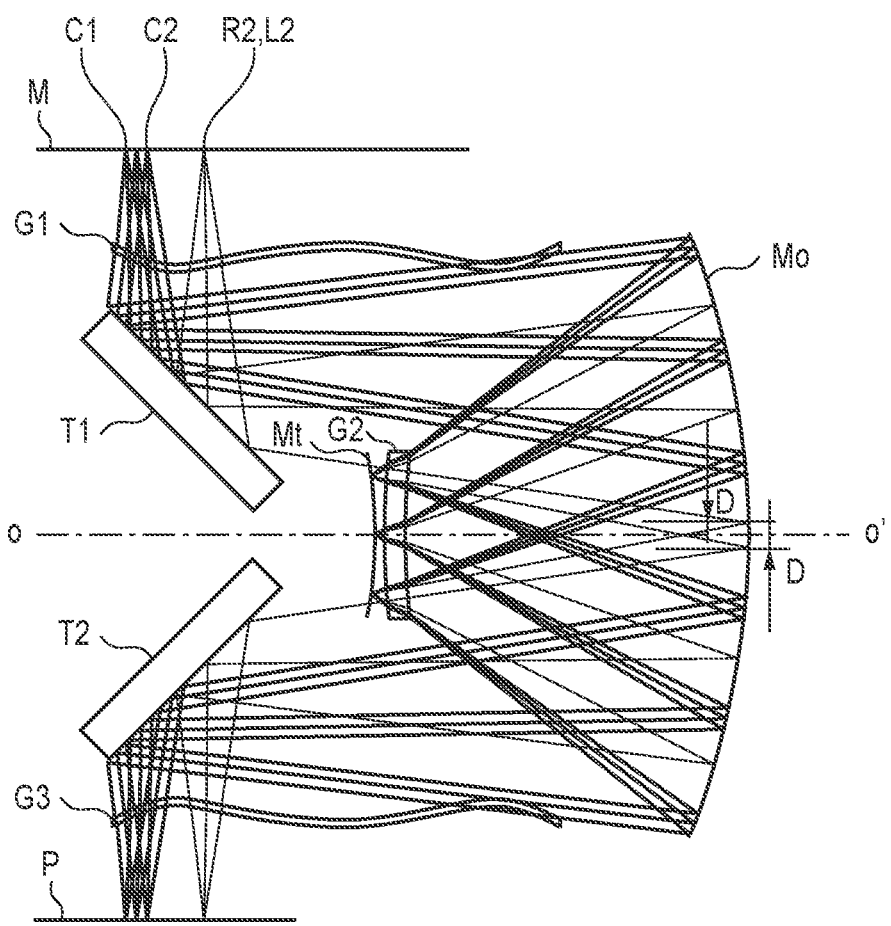
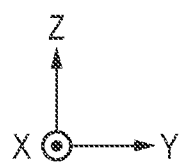

FIG. 8
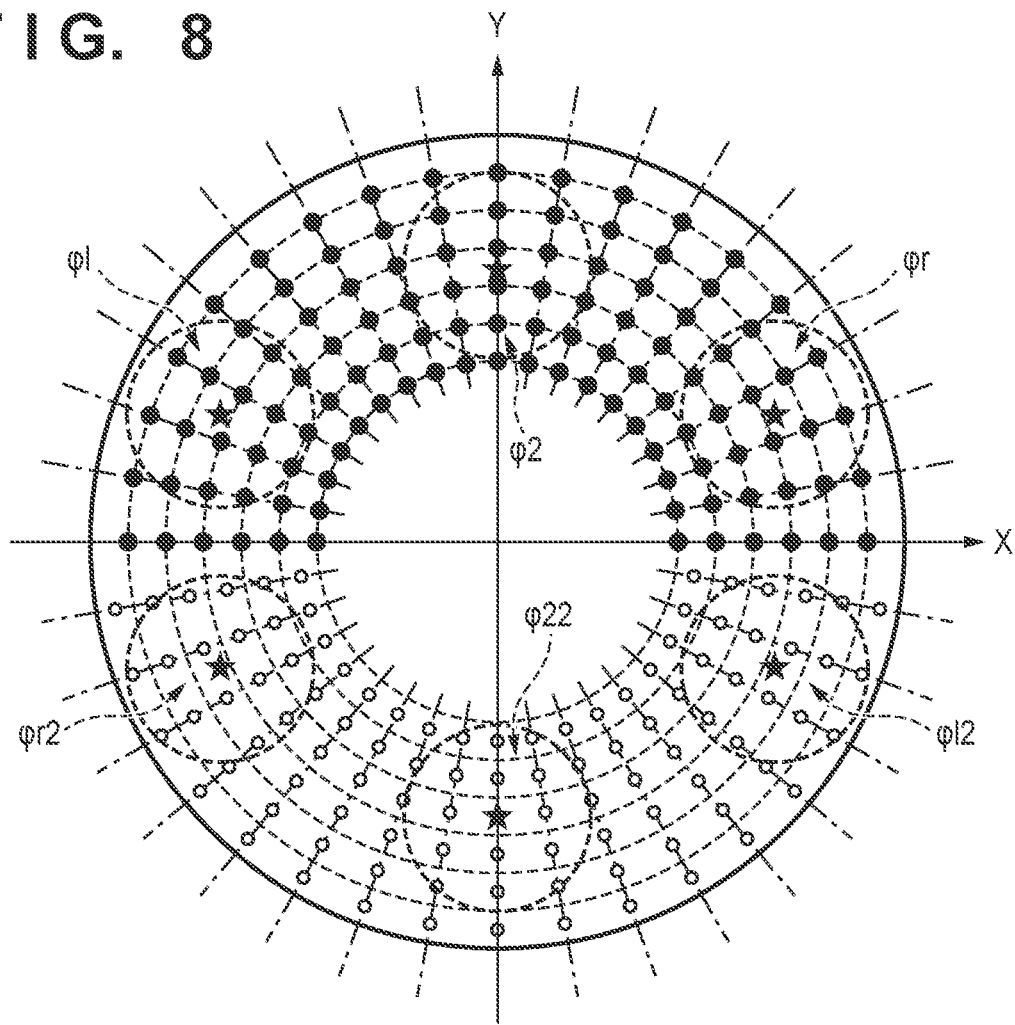
FIG. 9  SYNTHESIS OF UPPER AND LOWER LIGHT FLUXES
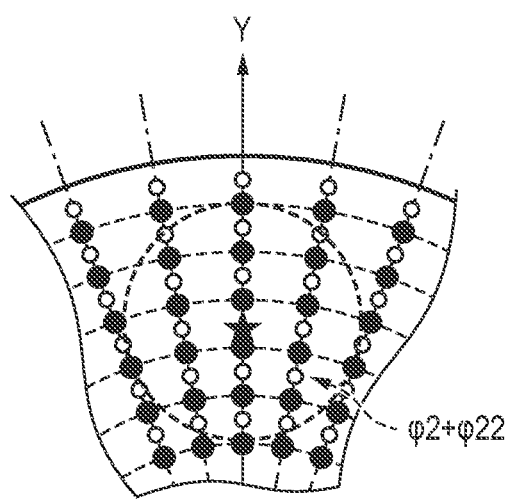

FIG. 10
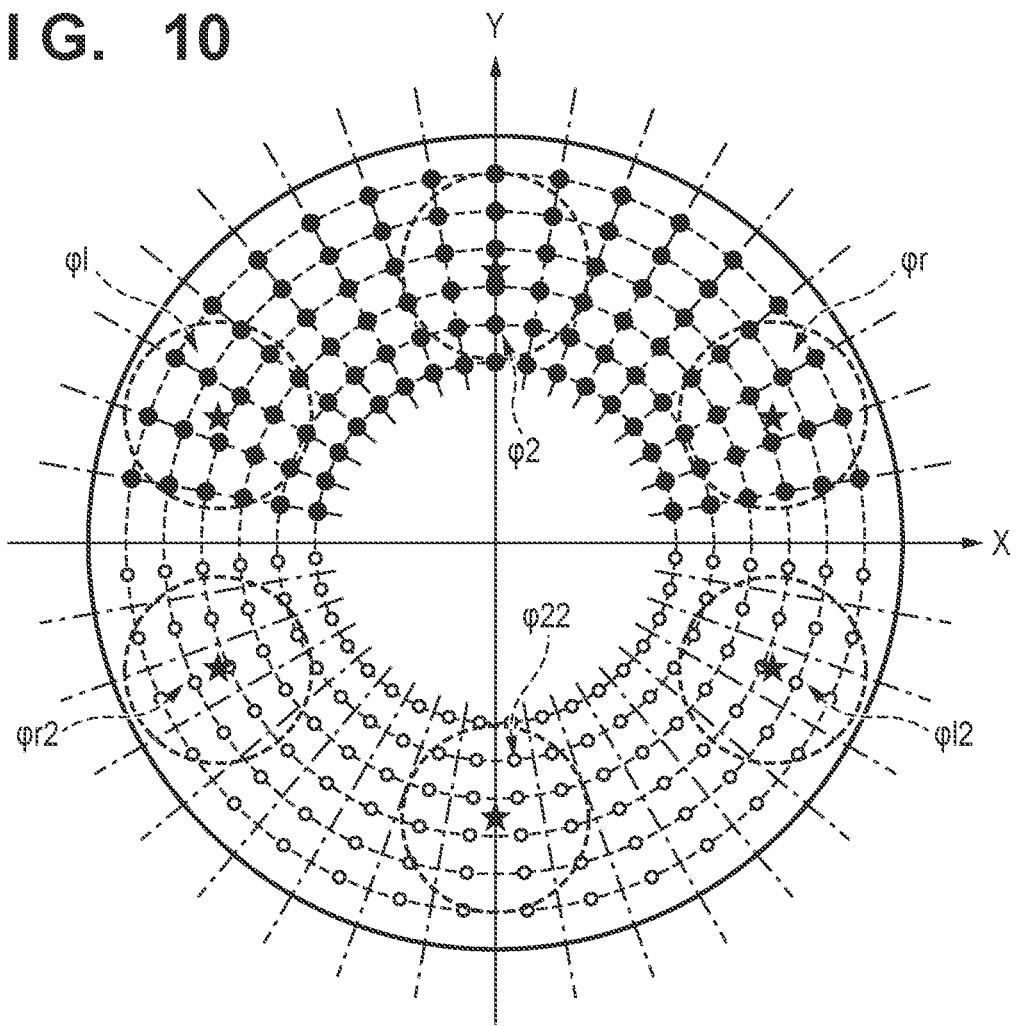
FIG. 11 SYNTHESIS OF UPPER AND LOWER LIGHT FLUXES
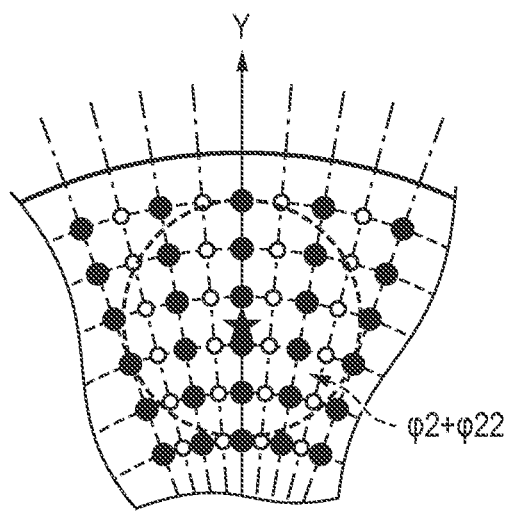

FIG. 17A
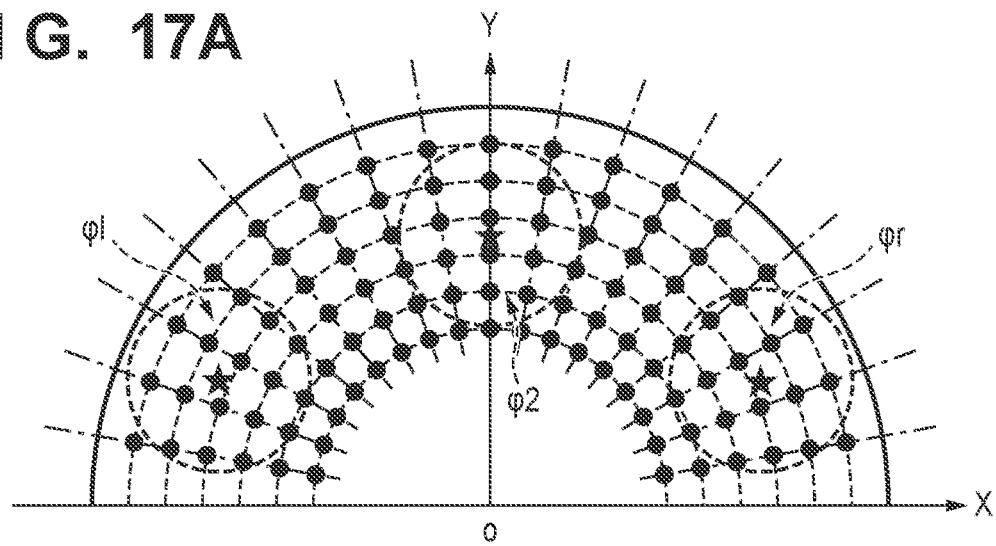
FIG. 17B
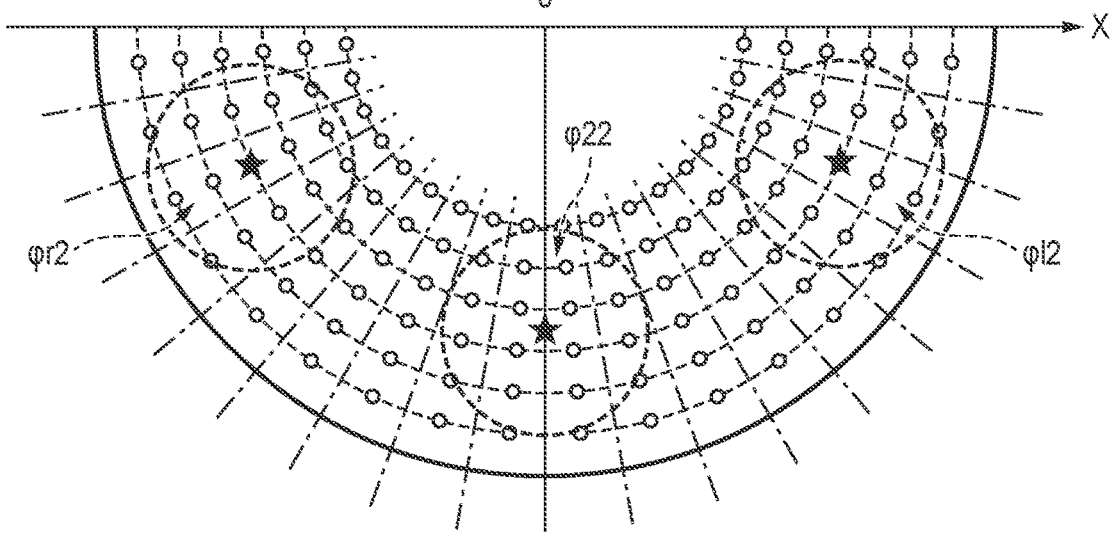
FIG. 18  SYNTHESIS OF UPPER AND LOWER LIGHT FLUXES
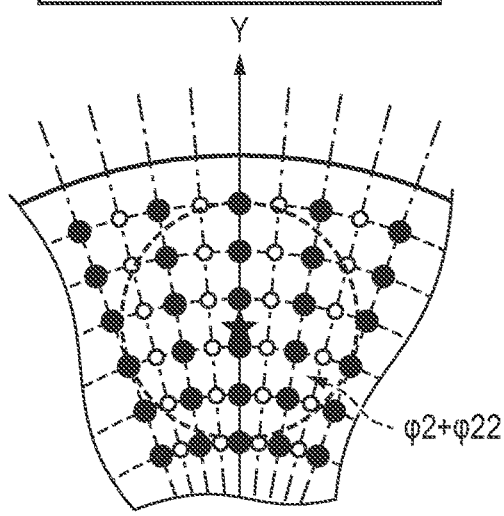

IMAGING OPTICAL SYSTEM, EXPOSURE APPARATUS, AND ARTICLE MANUFACTURING METHOD

BACKGROUND OF THE INVENTION

Field of the Invention

The present invention relates to an imaging optical system, an exposure apparatus, and an article manufacturing method.

Description of the Related Art

An exposure apparatus is an apparatus that transfers the pattern of an original (reticle or mask) onto a photosensitive substrate (for example, a wafer or glass plate with a resist layer formed on the surface) via a projection optical system in a lithography process that is a manufacturing process of a semiconductor device, a liquid-crystal display device, or the like. In general, as a projection optical system of an exposure apparatus, a reflective projection optical system is used that includes a concave mirror and a convex mirror arranged almost concentrically with each other, and images the pattern of a mask on a substrate using an off-axis annular good image area. In such an optical system, it has been proposed that a large-diameter concave mirror is used as a deformable mirror for aberration correction (for example, see Japanese Patent Laid-Open Nos. 2019-28352 and 2017-211493). A plurality of correction points, which apply a force to correct the surface shape of the concave mirror, are arranged in the deformable mirror. In terms of optical performance, it is desirable to provide as many correction points as possible in a light flux.

When a deformable mirror is applied to a reflective projection optical system, a light flux emitted from one point on a mask is reflected by the mirror a plurality of times before it is imaged on a substrate. Particularly, when a large-diameter concave mirror is used, a light flux is reflected twice in areas symmetric with respect to the centerline of the concave mirror. In a conventional deformable mirror, a plurality of correction points are point-symmetrically arranged. In this case, a single point in a light flux emitted from one point on the mask is corrected twice in the spread of the light flux. This means that the number of points that can be corrected in the light flux is not substantially increased.

In addition, since each of the plurality of correction points is formed from a complicated mechanical member and generates heat when driven, the distance between adjacent correction points cannot be easily reduced. Therefore, it is difficult to arrange a large number of correction points on one reflecting surface.

SUMMARY OF THE INVENTION

From the above problems, the more effective arrangement of the surface-shape correction points with respect to the light flux is required. In consideration of the above-described problems, the present invention provides a technique advantageous in improving the aberration correction accuracy.

The present invention in its one aspect provides an imaging optical system that includes a plurality of reflecting surfaces which reflect light, and images a light flux emitted from an object plane on an image plane via the plurality of reflecting surfaces, the system comprising a plurality of adjusters configured to adjust a shape of each of at least two reflecting surfaces of the plurality of reflecting surfaces by applying a force to a rear surface of each of the at least two reflecting surfaces, wherein if points obtained by projecting force acting points of the plurality of adjusters in an optical axis direction defined with respect to the reflecting surface are defined as correction points, the acting points are set such that, when a first ray and a second ray in a light flux emitted from one point on the object plane are reflected by a first reflecting surface and a second reflecting surface, the first ray strikes the correction point of the first reflecting surface but does not strike the correction point of the second reflecting surface, and the second ray does not strike the correction point of the first reflecting surface but strikes the correction point of the second reflecting surface.

Further features of the present invention will become apparent from the following description of exemplary embodiments (with reference to the attached drawings).

BRIEF DESCRIPTION OF THE DRAWINGS

FIG. 1 is an optical path diagram of a projection optical system according to the first embodiment;

FIG. 8 is a view showing the positional relationship between the effective light flux areas and correction points in the first embodiment;

FIG. 9 is a view showing the array of effective correction points in one light flux in the first embodiment;

FIG. 10 is a view showing the positional relationship between the effective light flux areas and the correction points in the second embodiment;

FIG. 11 is a view showing the array of effective correction points in one light flux in the second embodiment;

FIGS. 17A and 17B are schematic views showing the positional relationship between the effective light flux area and the correction points on the first and second concave mirrors, respectively, in the fifth embodiment;

FIG. 18 is a view showing the array of effective correction points in one light flux in the fifth embodiment;

DESCRIPTION OF THE EMBODIMENTS

Figure 2A:
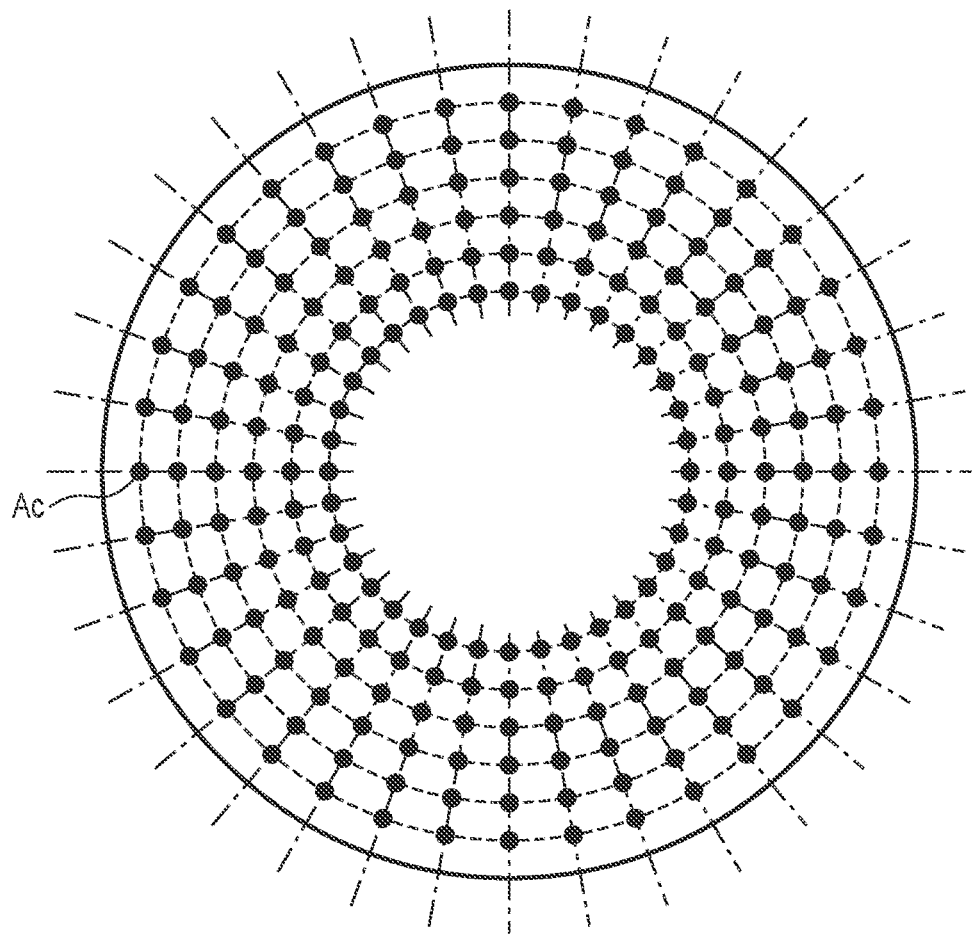
FIGS. 2A and 2B are views showing the arrangement of actuators of a deformable mirror in a conventional example.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 26:
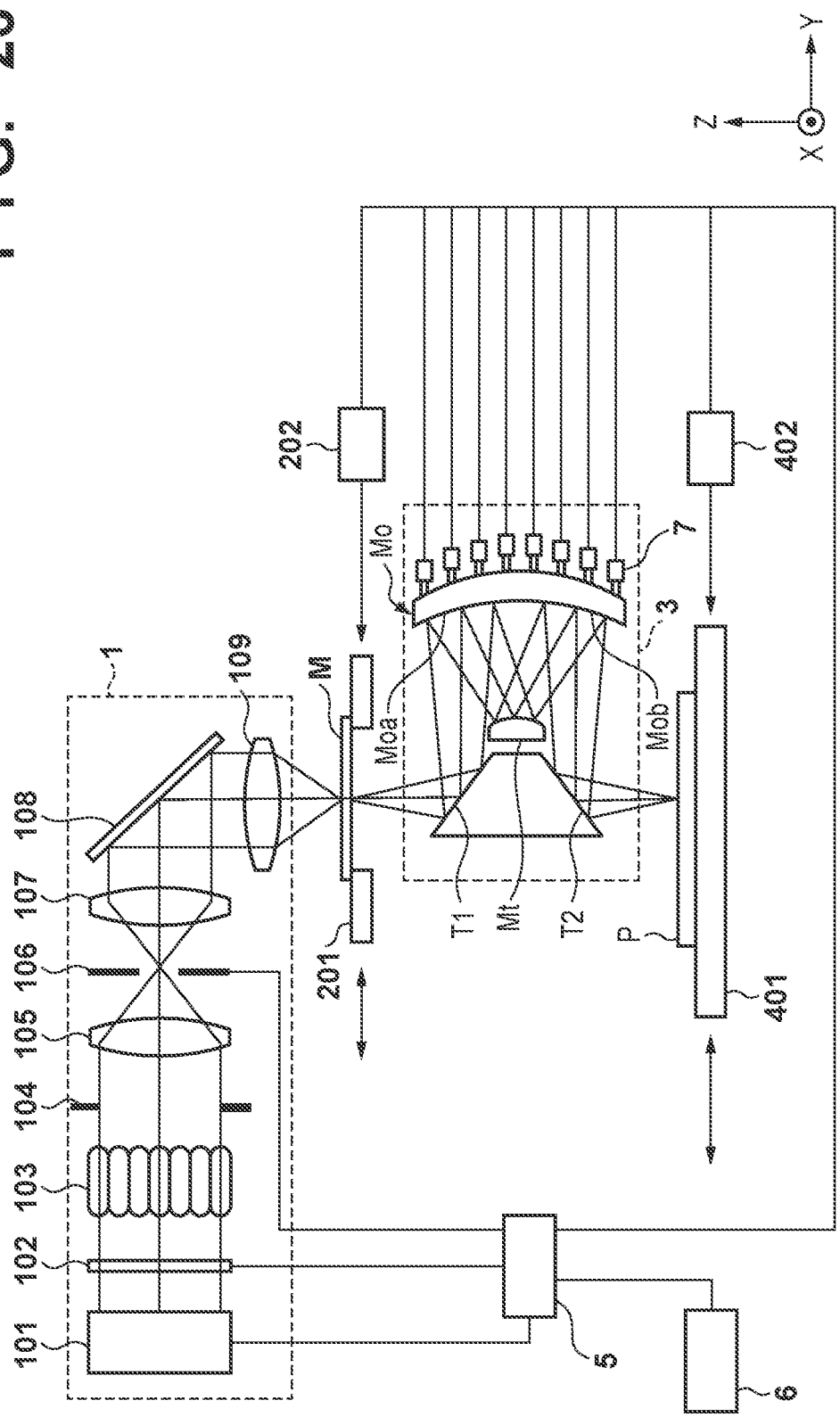
FIG. 26 is a view showing the arrangement of an exposure apparatus in the first and second embodiments.

FIG. 26 is a view showing the arrangement of an exposure apparatus in an embodiment. In this specification, directions will be indicated on an XYZ coordinate system in which a horizontal surface is defined as the X-Y plane. In general, a substrate P is placed on a substrate stage 401 such that the surface of the substrate P becomes parallel to the horizontal surface (X-Y plane). Accordingly, in the following description, directions orthogonal to each other in the plane along the surface of the substrate P are defined as the X-axis and the Y-axis, and the direction perpendicular to the X- and Y-axes is defined as the Z-axis. However, due to the arrangement of the exposure apparatus, the relationship between the Z-axis and the Y-axis can be mutually converted by a deflecting mirror. Hence, the relationship between the Z-axis and the Y-axis may be interchanged depending on the drawing to be referred to.

An illumination optical system 1 can include a light source 101, an ND filter 102, an optical integrator 103, an aperture stop 104, a condenser lens 105, a slit 106, a lens 107, a mirror 108, and a lens 109. The light source 101 is a high-pressure mercury lamp or the like, and emits ultraviolet light. The ND filter 102 has a predetermined transmittance, and adjusts the intensity of light emitted from the light source 101. The optical integrator 103 is formed from, for example, a fly-eye lens. The fly-eye lens is formed from a set of a plurality of minute lenses, and a plurality of secondary light sources are formed in the vicinity of the light emitting surface thereof. The aperture stop 104 is an aperture stop for determining the overall shape of the set of secondary light sources formed by the optical integrator 103. The overall shape of the set of secondary light sources is called an illumination shape. The condenser lens 105 performs Koehler illumination for the slit 106 using the light from the optical integrator 103. The slit 106 shapes the light from the light source. An opening portion of the slit 106 is formed into a shape that illuminates a mask by a masking blade. The light having passed through the slit 106 illuminates a mask M via the lens 107, the mirror 108, and the lens 109.

A mask stage 201 can hold the mask M and move in the Y-axis direction. A laser interferometer 202 measures the position of the mask stage 201.

A projection optical system 3 is an imaging optical system that includes a plurality of mirrors each including a reflecting surface which reflects light and a rear surface which is a surface on the opposite side of the reflecting surface, and images a light flux emitted from an object plane on an image plane via the reflective surfaces of the plurality of mirrors. More specifically, the projection optical system 3 projects a pattern (for example, a circuit pattern) drawn on the mask M onto the substrate P which is a substrate with a photosensitive agent applied thereon. The projection optical system 3 is a so-called Offner optical system. In an Offner optical system, in order to ensure a good image area, arcuate light is applied to the mask M. Accordingly, each of the shape of a light transmissive portion (opening portion) of the slit 106 and the irradiation shape of the exposure light reaching the substrate P is arcuate. The light transmitted through the pattern of the mask M reaches the substrate P after being reflected by a first plane mirror T1, a first reflecting area Moa of a concave mirror Mo, a convex mirror Mt, a second reflecting area Mob of the concave mirror Mo, and a second plane mirror T2 in the mentioned order. Thus, the pattern of the mask M is transferred onto the substrate P.

Here, the concave mirror Mo is described as one mirror including the first reflecting area Moa and the second reflecting area Mob. However, since the light is reflected twice by the first reflecting area Moa and the second reflecting area Mob, the concave mirror Mo is substantially the same as being divided into a first concave mirror including the first reflecting area Moa and a second concave mirror including the second reflecting area Mob. However, the projection optical system shown in FIG. 26 is intended to perform imaging at an equal magnification and need not be formed from separate bodies. Therefore, here, the first concave mirror and the second concave mirror are formed from a single optical member, so that the concave mirror Mo is described as one mirror. The arrangement in which the concave mirror Mo is divided into two bodies to provide an enlargement system or a reduction system will be described later.

The substrate stage 401 can hold the substrate P and move in at least the X direction and the Y direction. By the substrate stage 401 holding the substrate P and driving in the Y direction in synchronization with the mask stage 201, scanning exposure of the substrate P can be performed. A control unit 5 is formed from, for example, a computer including a CPU and a memory, and comprehensively controls an operation of the exposure apparatus including scanning exposure.

A user can perform setting of various kinds of parameters of the exposure apparatus via an operation unit 6. An input parameter value is transmitted to the control unit 5, and the control unit 5 can adjust each unit in the exposure apparatus.

In this embodiment, in the projection optical system 3 that projects a pattern using an off-axis annular shaped good image area, at least two mirrors of the plurality of mirrors are deformable mirrors. By effectively correcting the surface shapes of the deformable mirrors, the magnification or distortion in a screen, focus, and an optical aberration such as astigmatism are improved. For example, in the projection optical system 3, the concave mirror Mo substantially including the first concave mirror and the second concave mirror is a deformable mirror, and a plurality of adjusters 7 each of which applies a force to each of a plurality of portions on the rear surface of the concave mirror Mo are provided. Each of the plurality of adjusters 7 can be formed from an actuator such as a voice coil motor.

In this specification, each of the force acting points of the plurality of adjusters 7 on the deformable mirror is also referred to as an adjustment point. Further, points obtained by projecting the adjustment points onto the reflecting surface of the deformable mirror in the optical axis direction defined with respect to the deformable mirror (for example, the concave mirror) are defined as correction points. Note that the "point" here is a virtual point having no area.

Figure 2B:
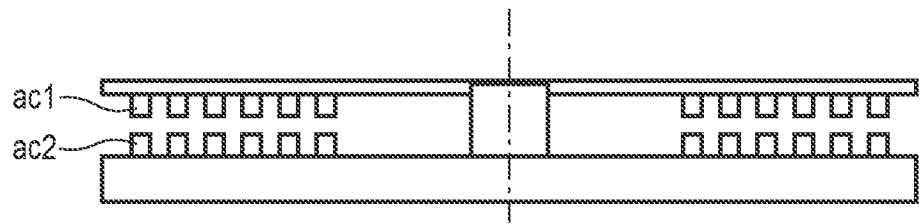

FIGS. 2A and 2B are a plan view and a sectional view, respectively, showing an arrangement example of the actuators in a case in which the concave mirror used in a projection optical system disclosed in Japanese Patent Laid-Open No. 2019-28352 is a deformable mirror. In FIGS. 2A and 2B, a plurality of adjustment points Ac, each being formed from a pair of an actuator element ac1 (for example, a magnet) and an actuator element ac2 (for example, a coil), are arrayed in the circumferential direction and the radial direction (the direction in which the radial vector extends) in the cross section of the optical axis. In the example shown in FIGS. 2A and 2B, the adjustment points Ac are point-symmetrically arranged with respect to the optical axis and, as described in Japanese Patent Laid-Open No. 2017-211493, they are driven in accordance with a correction instruction value based on the optical abbreviation or the surface displacement amount. With such an arrangement, the surface shape on the reflecting surface side is deformed.

Figure 3:
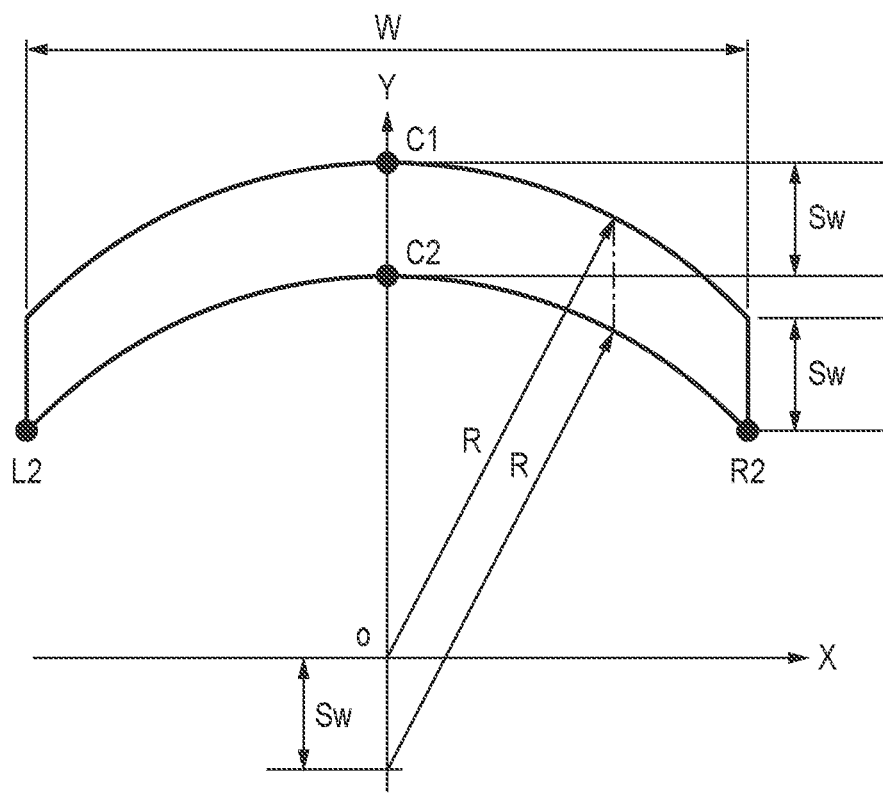
FIG. 3 is a view showing an arcuate exposure area on a mask surface.
Figure 4:
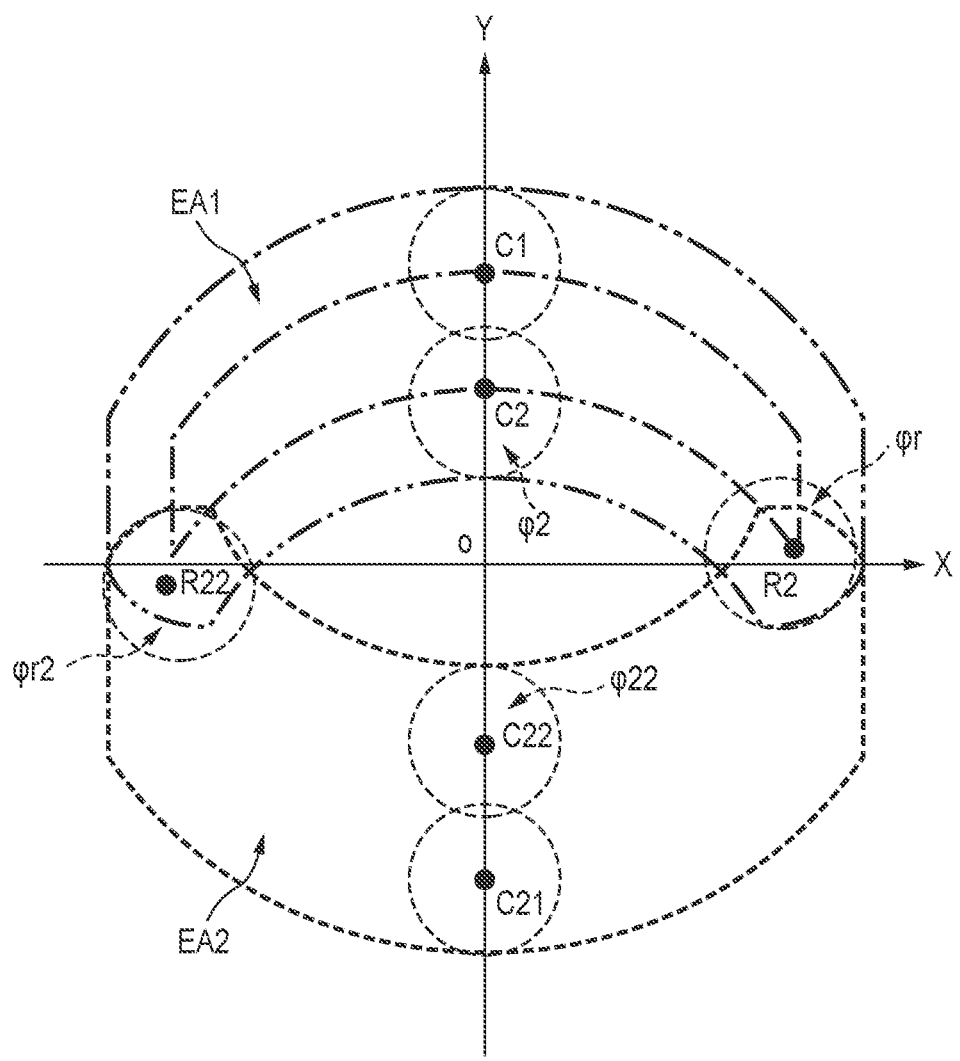
FIG. 4 is a schematic view showing effective light flux areas on a conventional concave mirror.

Next, the positional relationship between spreading of a light flux and the correction points on the concave mirror will be described. With reference to FIGS. 3 and 4, the effective light flux on the concave mirror will be described. FIG. 3 is a view showing an arcuate exposure area on the mask surface M. As has been described above, the opening portion of the slit 106 located inside the illumination optical system 1 has the arcuate shape. This slit 106 allows selective illumination on only the off-axis annular good image area of the projection optical system 3. FIG. 3 shows the exposure area, and an illumination area having an exposure width W in the X-axis direction and a slit width Sw in the Y-axis direction is formed. In FIG. 3, the Y direction on the mask surface M corresponds to the transverse direction within the drawing surface in FIG. 1 which is a ray diagram of the projection optical system 3 to be described later. The mask and the substrate are synchronously scanned in this direction to expose the overall surface of the substrate. In FIG. 3, R indicates the outermost radius of the arc forming the annular exposure area, and the center of the arc matches an optical axis o of the projection optical system. The innermost arc exists at a position obtained by shifting the arc by Sw in the Y direction (scanning direction).

By providing such an illumination area, when performing scanning exposure of the mask and the substrate, a uniform integrated exposure amount can be obtained over the entire exposure width (X direction). Note that in order to obtain the uniform integrated exposure amount, different from FIG. 3, it is also possible to match the center of the innermost radius of the arc with the optical axis o and form the outermost arc at a position obtained by shifting the innermost radius by Sw in the Y direction. In FIG. 3, a point C1 indicates the highest point of the arc on the Y-axis, and a point C2 indicates the lowest point thereof. Further, points R2 and L2 indicate right and left lowest points of the arc farthest from the Y-axis in the X direction, respectively. A light flux emitted from one point on the mask is reflected by the mirror a plurality of times before it is imaged on the substrate. In a large-diameter concave mirror, the light flux is reflected twice in areas point-symmetric with respect to the center of the concave mirror.

FIG. 4 is a schematic view showing the effective light flux areas on the concave mirror Mo. More strictly, FIG. 4 is a view in which the light flux is projected onto a plane which is perpendicular to the optical axis (extending in the Z-axis direction) of the projection optical system 3 and passes through the optical axis of the concave mirror Mo. Therefore, the Y-axis in FIG. 4 corresponds to the Z-axis in FIG. 1. Details of FIG. 1 will be described in the first embodiment to be described later. An area EA1 surrounded by an alternate long and two short dashed line is an effective light flux area at the time of the first reflection of the light flux by the concave mirror, and an area EA2 surrounded by a dashed line is an effective light flux area at the time of the second reflection by the concave mirror. Here, a light flux ($\varphi 2$ centered on C2) emitted from the point C2 in the central portion of the arc and reflected by the concave mirror for the first time and a light flux ($\varphi 22$ centered on C22) reflected by the concave mirror for the second time are shown. In addition, a light flux ($\varphi r$ centered on R2) emitted from the point R2 in the right end portion of the arc and reflected by the concave mirror for the first time and a light flux ($\varphi 2$ centered on R22) reflected by the concave mirror for the second time are shown.

Figure 5:
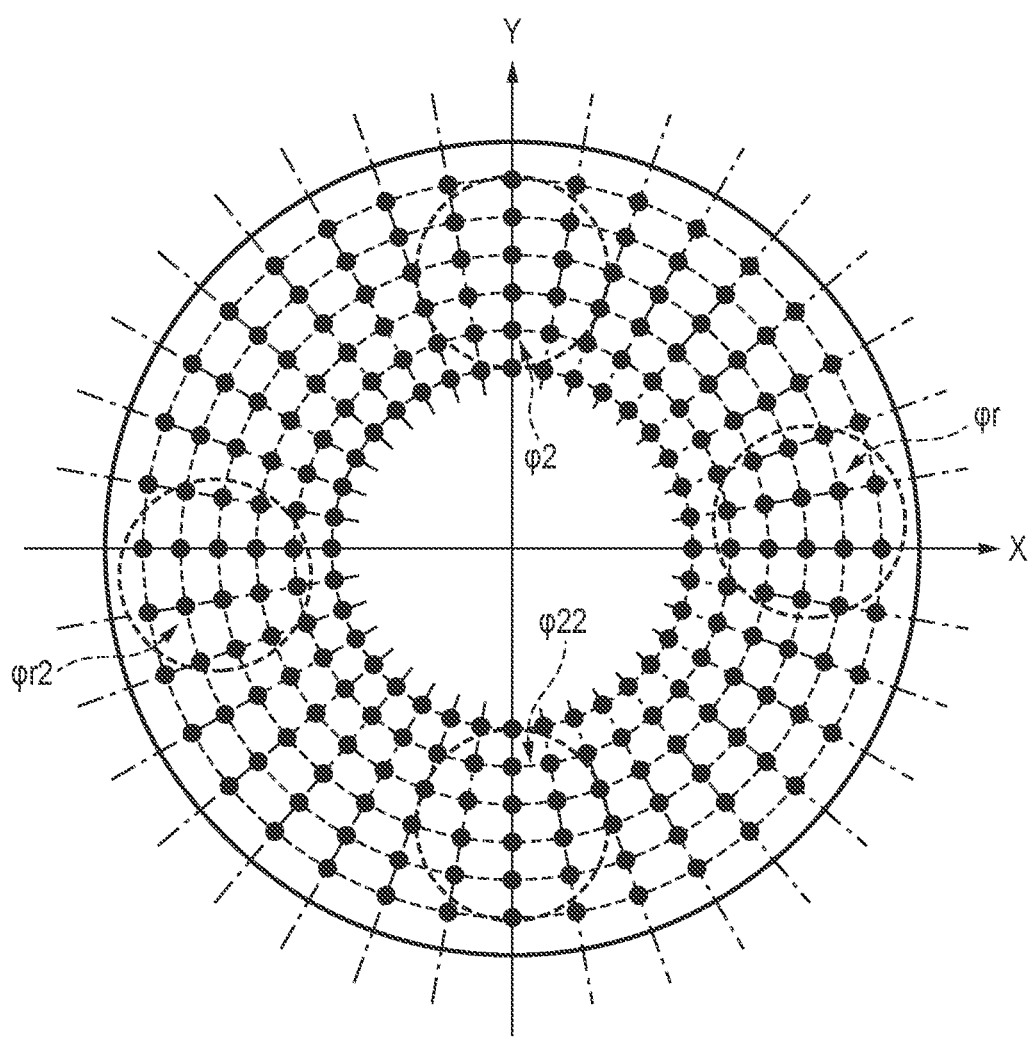
FIG. 5 is a view showing the positional relationship between the effective light flux area and correction points on the conventional concave mirror.

FIG. 5 is a view obtained by superposing FIG. 2 and FIG. 4, and a view showing the relationship between the arrangement state of the correction point arrays and the effective light flux area on the concave mirror. As in FIG. 4, the Y-axis in FIG. 5 corresponds to the Z-axis in FIG. 1. It can be seen that the point arrays for correcting the surface shape exist in the light fluxes emitted from the points C2 and R2 on the arc. Here, attention should be paid to the point that the light flux reflected on the concave mirror for the first time and the light flux reflected on the concave mirror for the second time are point-symmetrically arranged with respect to the optical axis, and the correction point arrays on the concave mirror are also point-symmetrically arranged as shown in FIG. 2. With this arrangement, a single point in the light flux emitted from one point on the mask is corrected twice in the spread of the light flux. This means that the number of effective correction points is small, and has following problems. In terms of the optical performance, it is necessary to provide as many correction points as possible in the light flux to correct the higher-order aberration represented by the Zernike expansion term. In the future, as the NA rises, this demand will become stronger. On the other hand, each correction point is formed from a complicated mechanical member and, moreover, generates heat when driven. Accordingly, the distance between adjacent correction points cannot be easily reduced. In other words, a large number of correction points cannot be arranged on one reflecting surface. Therefore, the more effective arrangement of the surface-shape correction point array with respect to the light flux is required. An arrangement example for solving the above-described problems will be described in each of following embodiments.

First Embodiment

FIG. 1 is a ray diagram of a projection optical system 3 in the first embodiment. Points C1, C2, R2, and L2 on a mask surface M are shown in FIG. 3. A light flux emitted from each of these points passes through an optical member G1 immediately below the mask surface, has its optical path bent at a right angle by the action of a first plane mirror T1, and then strikes a concave mirror Mo. The light flux reflected by the concave mirror Mo passes through an optical member G2 located in the vicinity of an optical axis oo', and then strikes a convex mirror Mt. The convex mirror Mt is located on the aperture plane of the projection optical system 3. The light flux reflected by the convex mirror Mt passes through the optical member G2 again, and then strikes the concave mirror Mo. The light flux reflected by the concave mirror Mo again travels toward a second plane mirror T2, has its optical path bent at a right angle by the action of the second plane mirror T2, passes through an optical member G3 immediately above a substrate P, and is imaged on the substrate P. Each of the above-described optical members G1 and G3 arranged in the vicinity of the mask and in the vicinity of the substrate, respectively, is an optical member having a refractive power, and can include, for example, a lens having an aspherical shape.

In FIG. 1, a distance D between the optical axis oo' and the point of the light flux emitted from each of the points R2 and L2 on the mask surface, the point being closest to the optical axis oo' on the concave mirror Mo, is shown. Note that since the projection optical system 3 is an equal-magnification system, the optical system and the optical path are vertically symmetric with respect to the convex mirror Mt located on the aperture plane of the projection optical system 3. Hence, the upper distance from the optical axis oo' and the lower distance from the optical axis oo' are both equal to D. In this embodiment, the imaging magnification is the equal-magnification. In one example, the numerical aperture (NA) is 0.135, and the exposure width is 820 mm. The arc radius is 600 mm, and the slit width is 60 mm. As the exposure wavelength, DUV light in the band ranging from 300 nm to 365 nm is used, and aberration correction is performed thereon. A curvature radius R of each optical member, the distance D, an optical refractive index N of a glass member, and the reference symbols of the corresponding optical members for implementing the above-described configuration are summarized in Table 1 below. Note that each of some optical members is formed to have an aspherical surface, and an equation for defining the aspherical shape is given by following equation 1. Examples of respective coefficients are shown in Table 2 below.

$$z = rh^2/(1+(1-(1+k)r^2h^2)^{1/2}) + Ah^4 + Bh^6 + Ch^8 + Dh^{10} + Eh^{12} + Fh^{14} + Gh^{16} + Hh^{18} + Jh^{20} \quad (1)$$

where r is 1/R in Table 1.

TABLE 1

| Surface Number | | R | D | N | |
|---|---|---|---|---|---|
| Object | | 0 | 0 | | |
| 1 | | 0 | 264.56 | | |
| 2 | Aspheric surface | 962.2 | 24.6 | 'sio2' | G1 |
| 3 | Aspheric surface | 1074.3 | 20 | | |
| 4 | | 0 | 0 | | |
| 5 | | 0 | 0 | | |
| 6 | | 0 | 20 | | |
| 7 | | 0 | 20 | | |
| 8 | | 0 | 20 | | |
| 9 | | 0 | 20 | | |
| 10 | | 0 | 20 | | |
| 11 | | 0 | 690.84 | | |
| 12 | | 0 | −200 | Reflective | T1 |
| 13 | | 0 | 0 | | |
| 14 | | −3569.54 | −975.46 | | |
| 15 | | 2241.29 | 975.46 | Reflective | Mo |
| 16 | | 0 | 0 | | |
| 17 | | 0 | 0 | | |
| 18 | | 0 | 0 | | |
| 19 | | 0 | 0 | | |
| 20 | Aspheric surface | −3569.54 | 59.83 | 'sio2' | G2 |
| 21 | | −3211.4 | 30 | | |
| 22 | | 1156.82 | −30 | Reflective | Mt |
| 23 | | −3211.4 | −59.83 | 'sio2' | |
| 24 | Aspheric surface | −3569.54 | 0 | | G2 |
| 25 | | 0 | 0 | | |
| 26 | | 0 | 0 | | |
| 27 | | 0 | 0 | | |
| 28 | | 0 | −975.46 | | |
| 29 | | 2241.29 | 975.46 | Reflective | Mo |
| 30 | | 0 | 0 | | |
| 31 | | 0 | 200 | | |
| 32 | | 0 | −690.84 | Reflective | T2 |
| 33 | | 0 | −20 | | |
| 34 | | 0 | −20 | | |
| 35 | | 0 | −20 | | |
| 36 | | 0 | −20 | | |
| 37 | | 0 | −20 | | |
| 38 | | 0 | 0 | | |
| 39 | | 0 | 0 | | |
| 40 | | 0 | −20 | | |
| 41 | Aspheric surface | 1074.3 | −24.6 | 'sio2' | G3 |
| 42 | Aspheric surface | 962.2 | −264.56 | | |
| Image plane | | | | | |

TABLE 2

Aspheric Surface Data

| Surface Number | K | A | B | C | D |
|---|---|---|---|---|---|
| 2 | 0.00E+00 | −5.12E−10 | −4.77E−15 | 6.55E−21 | −3.60E−27 |
| 3 | 0.00E+00 | −5.03E−10 | −3.05E−15 | −3.67E−21 | 3.60E−26 |
| 20 | 0.00E+00 | −2.79E−12 | −1.21E−15 | 1.02E−19 | −4.46E−24 |
| 24 | 0.00E+00 | −2.79E−12 | −1.21E−15 | 1.02E−19 | −4.46E−24 |
| 41 | 0.00E+00 | −5.03E−10 | −3.05E−15 | −3.67E−21 | 3.60E−26 |
| 42 | 0.00E+00 | −5.12E−10 | −4.77E−15 | 6.55E−21 | −3.60E−27 |

| Surface Number | E | F | G | H | J |
|---|---|---|---|---|---|
| 2 | 1.31E−32 | −3.76E−38 | 4.28E−44 | 0.00E+00 | 0.00E+00 |
| 3 | −7.85E−32 | 8.15E−38 | −2.60E−44 | 0.00E+00 | 0.00E+00 |
| 20 | 1.06E−28 | −1.30E−33 | 6.48E−39 | 0.00E+00 | 0.00E+00 |

TABLE 2-continued

| | | Aspheric Surface Data | | | |
|---|---|---|---|---|---|
| 24 | 1.06E−28 | −1.30E−33 | 6.48E−39 | 0.00E+00 | 0.00E+00 |
| 41 | −7.85E−32 | 8.15E−38 | −2.60E−44 | 0.00E+00 | 0.00E+00 |
| 42 | 1.31E−32 | −3.76E−38 | 4.28E−44 | 0.00E+00 | 0.00E+00 |

Figure 6:
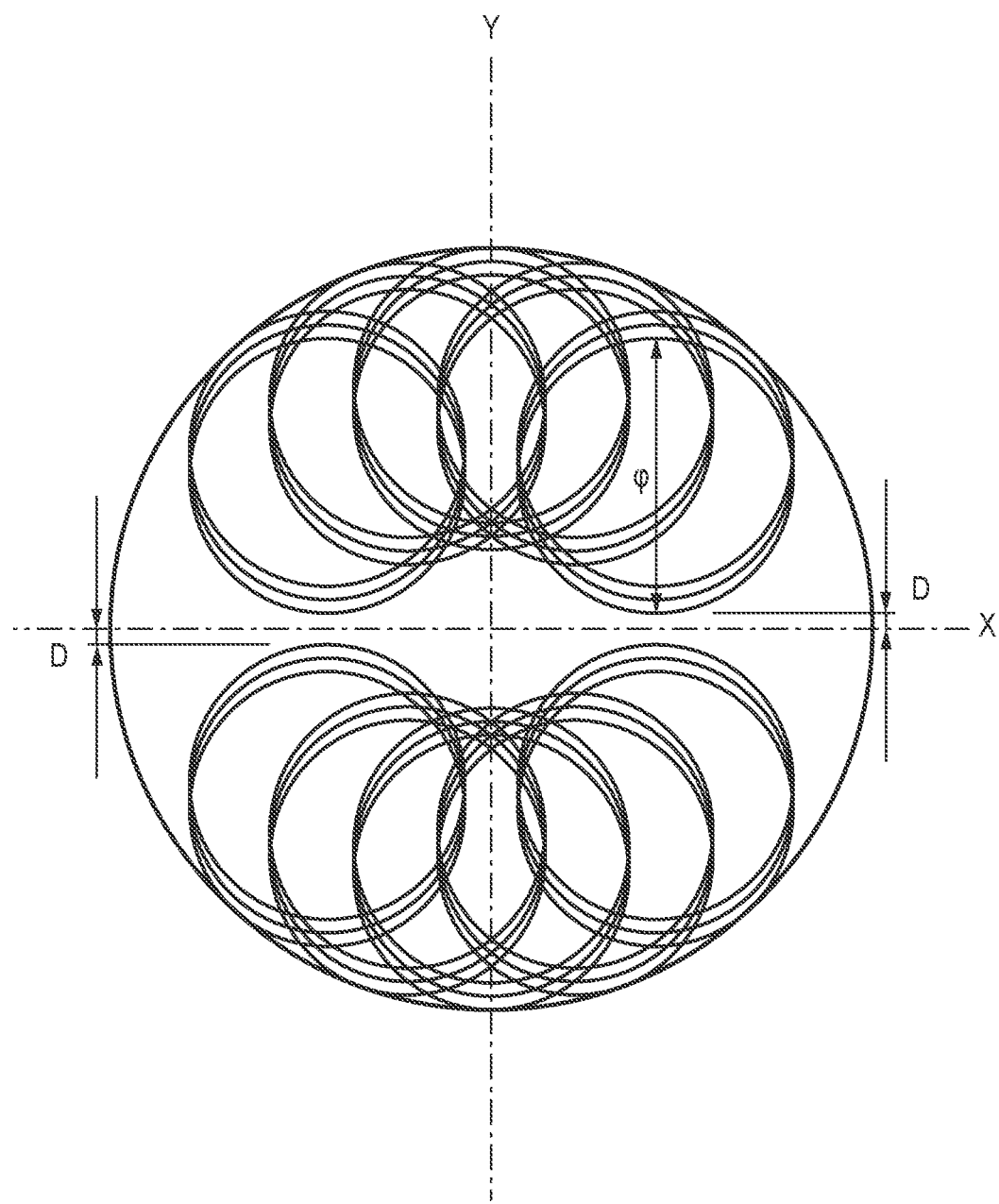
FIG. 6 is an optical trace diagram showing the effective light flux areas on a concave mirror in the first embodiment.

Here, with reference to FIGS. 6 and 7, the effective light flux on the concave mirror Mo will be described. FIG. 6 is an optical trace diagram showing the effective light flux areas on the concave mirror Mo in this embodiment. The Y-axis in FIG. 6 corresponds to the Z-axis in FIG. 1. From this diagram, it can be seen that the imaging light fluxes emitted from a total of 15 points including five points in the X direction and three points in the Y direction in the arcuate area on the mask surface M shown in FIG. 3 form a set of circles on the concave mirror Mo. In FIG. 6, φ indicates the diameter of the effective light flux, on the concave mirror Mo, of the light flux emitted from one point on the mask, and D indicates the minimum approach distance between the effective light flux group and the X-axis as shown in FIG. 1.

Figure 7:
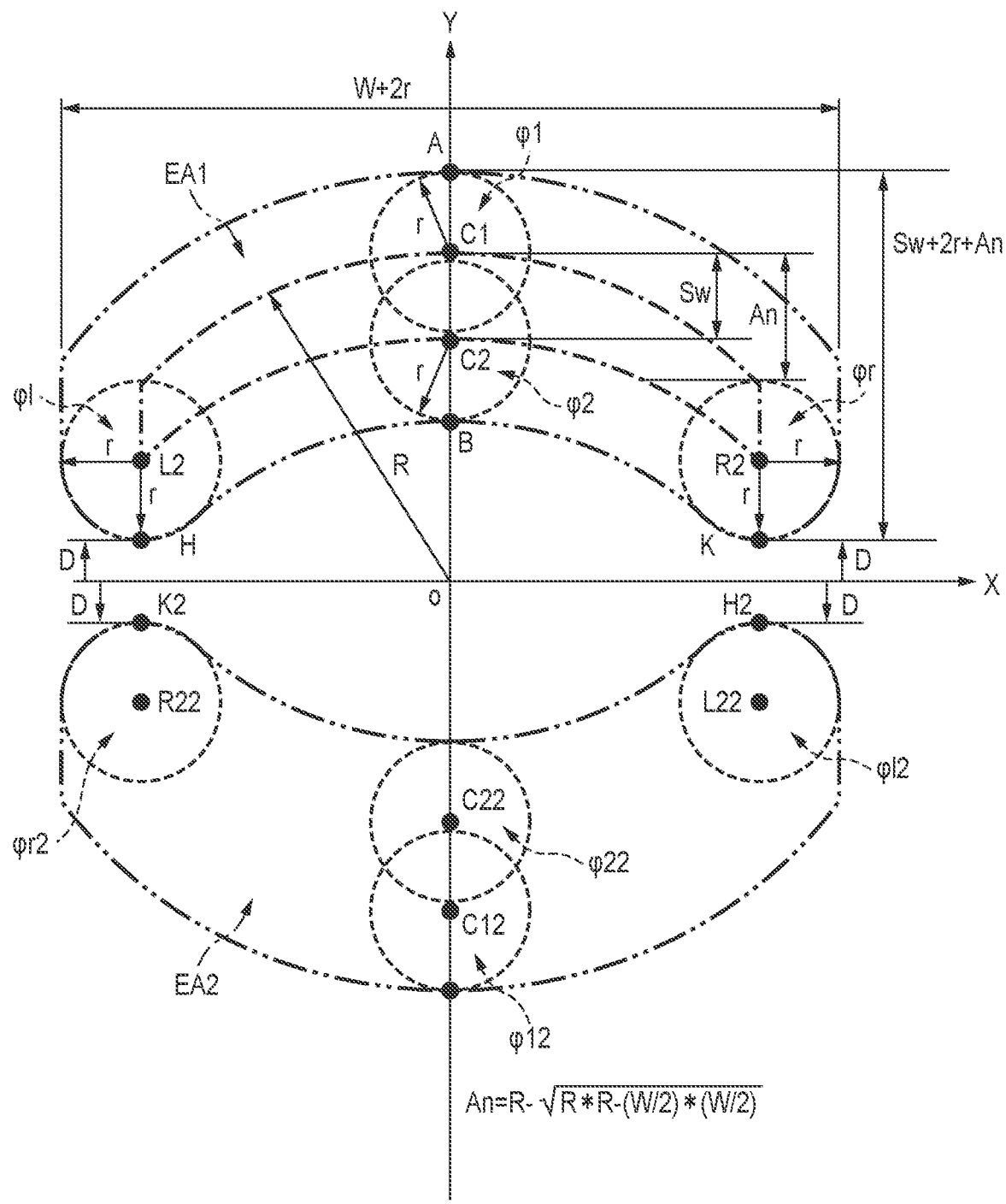
FIG. 7 is a schematic view showing the effective light flux areas on the concave mirror in the first embodiment.

FIG. 7 is a schematic view showing the effective light flux areas on the concave mirror Mo in the optical system shown in FIG. 1. More strictly, FIG. 7 is a view obtained by projecting the light fluxes onto a plane perpendicular to the optical axis oo' and passing through the optical axis of the concave mirror Mo. Hence, the Y-axis in FIG. 7 corresponds to the Z-axis in FIG. 1. In FIG. 1, the light flux bent by the first plane mirror T1 strikes the concave mirror Mo. In this embodiment, it is designed such that the principal ray is almost telecentric between the mask surface and the substrate surface. Hence, each principal ray of the imaging light flux emitted from each of the points (C1, C2, R2, and L2) on the mask surface M travels almost parallel to the optical axis oo' and strikes the concave mirror Mo. Accordingly, on the concave mirror Mo, the arcuate area shown in FIG. 3 is projected intact and the spread area of the imaging light flux is added thereto. Thus, the effective area of the light flux is determined. In FIG. 7, the arcuate area indicated by an alternate long and short dashed line is equal to the arcuate area on the mask surface shown in FIG. 3, and r indicates the radius of the light flux spread at each point. More specifically, r is almost equal to the product of the optical distance from the mask surface M to the concave mirror Mo and the numerical aperture (NA) of the imaging light flux. In FIG. 7, an amount of warpage An of the arc is defined by the following equation:

$$An = R - \sqrt{R*R - (W/2)*(W/2)}$$

Accordingly, as for the effective light flux area on the concave mirror Mo indicated by an alternate long and two short dashed line in FIG. 7, the spread width in the Y direction is expressed by $Sw+2r+An$ using the numerical values defined so far. The spread width in the X direction is expressed by $W+2r$. Here, in this embodiment, by giving attention to points K and H closest to the X-axis in the effective light flux area, the distance D between each of the points K and H and the X-axis is defined. The points K and H are the points of the light fluxes emitted from the points R2 and L2 on the mask surface in FIG. 3, respectively, the points being closest to the optical axis. Here, a circle group EA1 in the upper semicircle with respect to an optical axis o is a light flux group emitted from the mask surface and reflected by the concave mirror M for the first time, and the shortest distance D shown in FIG. 1 is also shown in FIG. 7. A circle group EA2 in the lower semicircle with respect to the optical axis o is a light flux group reflected by the concave mirror Mo for the second time. Since this optical system is the equal-magnification system, EA1 and EA2 are point-symmetrically arranged with respect to the optical axis o.

The area of the set of circles shown in FIG. 6 corresponds to the area surrounded by the alternate long and two short dashed line shown in FIG. 7. Further, the shortest distance D is also shown in FIG. 6 as a positive number, and this indicates that the upper and lower light fluxes are sufficiently separated from each other. In this embodiment, the diameter ($\varphi=2r$) of the effective light flux per point on the concave mirror is 645 mm, and the value of the shortest distance D is +57 mm.

In this embodiment, the force acting points of a plurality of adjusters 7 are set such that following two conditions (a) and (b) are satisfied when a first ray and a second ray in the light flux emitted from one point on the mask are reflected by the first concave mirror and the second concave mirror.

(a) The first ray strikes the correction point of the first concave mirror (a first reflecting area Moa of the concave mirror Mo), but does not strike the correction point of the second concave mirror (a second reflecting area Mob of the concave mirror Mo).

(b) The second ray does not strike the correction point of the first concave mirror (the first reflecting area Moa of the concave mirror Mo), but strikes the correction point of the second concave mirror (the second reflecting area Mob of the concave mirror Mo).

In order to implement this, for example, the plurality of adjusters 7 are arranged such that the force acting points of the plurality of adjusters 7 are non-axisymmetric with respect to a horizontal line (X-axis) orthogonal to the optical axis of the convex mirror Mt. A specific example of such setting of the acting points (adjustment points) will be described below with reference to FIGS. 8 and 9.

FIG. 8 is a view showing the relationship between the effective light flux areas and the correction points in this embodiment, and obtained by superimposing FIG. 2 and FIG. 7. Hence, the Y-axis in FIG. 7 corresponds to the Z-axis in FIG. 1. FIG. 8 is a view corresponding to FIG. 5 showing the conventional example, but the following points are different from FIG. 5. That is, in FIG. 8, the arrangement of the correction points in the area (including the first and second quadrants and to be referred to as the north hemisphere hereinafter) in which Y coordinates are positive with respect to the X-axis and the arrangement of the correction points in the area (including the third and fourth quadrants and to be referred to as the south hemisphere hereinafter) in which Y coordinates are negative with respect to the X-axis are shifted from each other. In the north hemisphere, all the correction points (black points in FIG. 8) are arranged on lines divided in the circumferential direction and the radial direction (the direction in which the radial vector extends). That is, in the north hemisphere, all the correction points are respectively arranged at intersection points of a plurality of concentric circles centered on the optical axis o and a plurality of radially extending radial vector lines centered on the optical axis o. On the other hand, in the south hemisphere, all the correction points (white points in FIG. 8) are arranged at positions shifted from the intersection points in the radial direction by half the pitch between the plurality of concentric circles. Note that in FIG. 8, a star mark is displayed at the center of each of six light fluxes. They indicate, as the center points of the respective light fluxes, the two reflecting positions, by the concave mirror Mo, of the principal ray of each of the light fluxes emitted from the three points (C2, R2, and L2) on the mask in FIG. 3. In this manner, in this embodiment, each adjustment point is set such that the correction point in the second reflecting area Mob of the concave mirror Mo (that is, the second concave mirror) is arranged at a position shifted from the correction point in the first reflecting area Moa of the concave mirror Mo (that is, the first concave mirror) in the radial direction centered on the optical axis o.

FIG. 9 is a view showing the array of effective correction points in one light flux in this embodiment. In FIG. 8, the light flux emitted from the point C2 on the mask forms φ2 and φ22 when reflected twice on the concave mirror Mo, and receives the action of the correction point groups existing in these areas. However, according to the arrangement shown in FIG. 8, the correction point groups in the two light fluxes are relatively shifted from each other in the radial direction. Therefore, as shown in FIG. 9, the correction point groups substantially double the correction point group in the conventional example exist in the light flux reaching on the substrate, and the light flux receives the action thereof. A similar effect can be obtained for the light fluxes emitted from the other points (R2 and L2) on the mask.

Second Embodiment

FIG. 10 is a view showing the relationship between the effective light flux areas and the correction points in the second embodiment, and obtained by superimposing FIG. 2 and FIG. 7. Hence, the Y-axis in FIG. 10 corresponds to the Z-axis in FIG. 1. FIG. 10 is the view corresponding to FIG. 8 in the first embodiment, but the arrangement mode of the correction points in the south hemisphere is different from that in FIG. 8. FIG. 10 is similar to FIG. 8 in that all the correction points (black points in FIG. 10) in the north hemisphere are respectively arranged at intersection points of a plurality of concentric circles centered on an optical axis o and a plurality of radially extending radial vector lines centered on the optical axis o. On the other hand, in the south hemisphere shown in FIG. 10, all the correction points (while points in FIG. 10) are arranged at positions shifted from the intersection points in the circumferential direction by half the pitch between the plurality of radial vector lines.

FIG. 11 is a view showing the array of effective correction points in one light flux in this embodiment. In FIG. 10, the light flux emitted from a point C2 on the mask forms φ2 and φ22 when reflected twice on a concave mirror Mo, and receives the action of the correction point groups existing in these areas. However, according to the arrangement shown in FIG. 10, the correction point groups in the two light fluxes are relatively shifted from each other in the circumferential direction. Therefore, as shown in FIG. 11, the correction point groups substantially double the correction point group in the conventional example exist in the light flux reaching on the substrate, and the light flux receives the action of the correction point groups. A similar effect can be obtained for the light fluxes emitted from other points (R2 and L2) on the mask.

Third Embodiment

Figure 27:
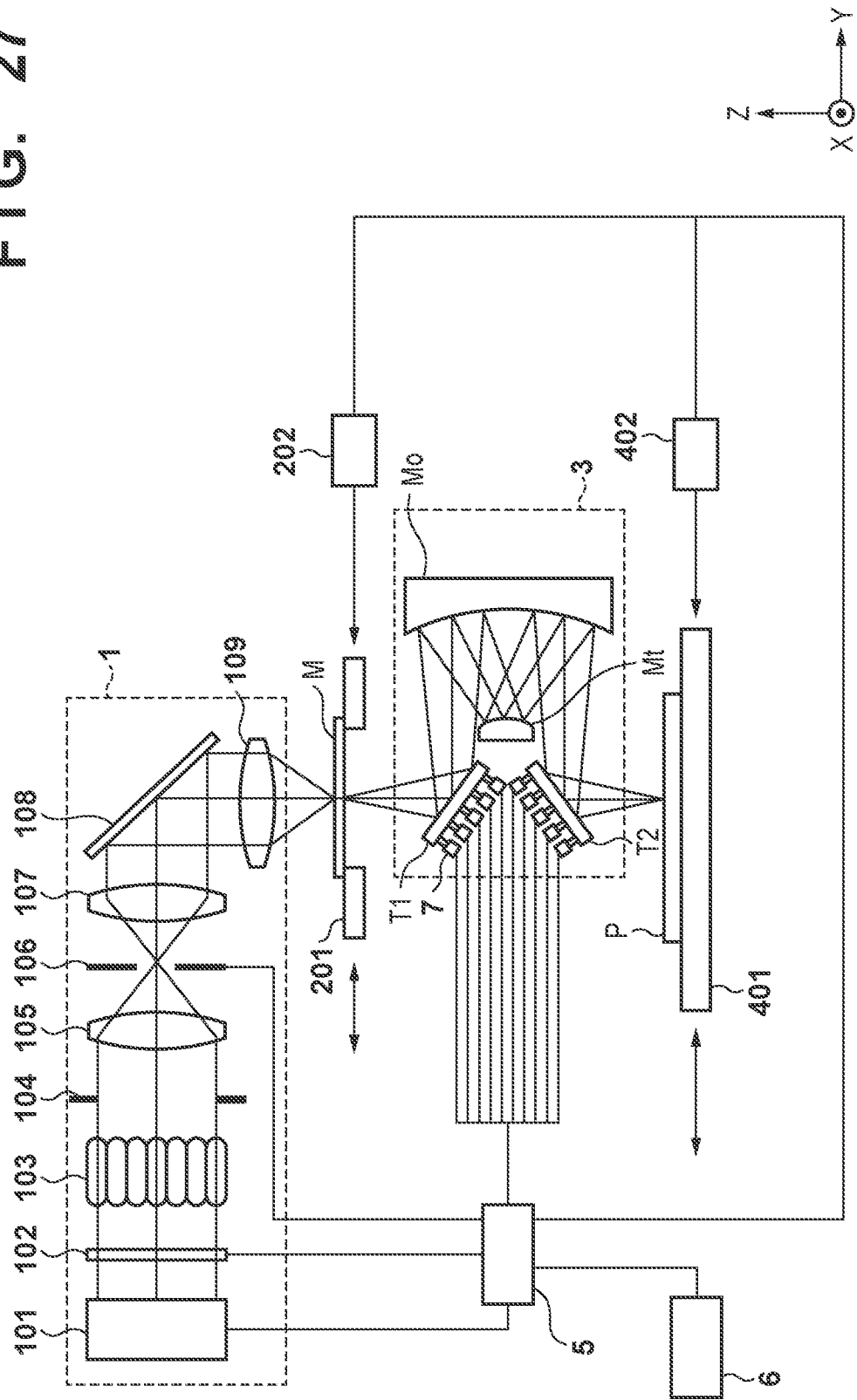
FIG. 27 is a view showing the arrangement of an exposure apparatus in the third and fourth embodiments.

FIG. 27 is a view showing the arrangement of the exposure apparatus in the third embodiment. FIG. 27 is different from FIG. 26 in that not a concave mirror Mo but a first plane mirror T1 and a second plane mirror T2 are deformable mirrors. Therefore, a plurality of adjusters 7 are arranged on the rear surfaces of the first plane mirror T1 and the second plane mirror T2.

In this embodiment, points obtained by projecting the force acting points of the plurality of adjusters 7 on the first plane mirror T1 in a direction orthogonal to the first plane mirror T1 and points obtained by projecting the force acting points of the plurality of adjusters 7 on the second plane mirror T2 in a direction orthogonal to the second plane mirror T2 are defined as the correction points.

In this embodiment, the force acting points of the plurality of adjusters 7 are set such that following two conditions (a) and (b) are satisfied when a first ray and a second ray in the light flux emitted from one point on the mask are reflected by the first plane mirror T1 and the second plane mirror T2.

(a) The first ray strikes the correction point of the first plane mirror T1, but does not strike the correction point of the second plane mirror T2.

(b) The second ray does not strike the correction point of the first plane mirror T1, but strikes the correction point of the second plane mirror T2.

In order to implement this, for example, the plurality of adjusters 7 are arranged such that the force acting points of the plurality of adjusters 7 are non-axisymmetric with respect to a horizontal line (X-axis) orthogonal to the optical axis of a convex mirror Mt. A specific example of such setting of the acting points (adjustment points) will be described below with reference to FIGS. 12 and 13.

Figure 12:
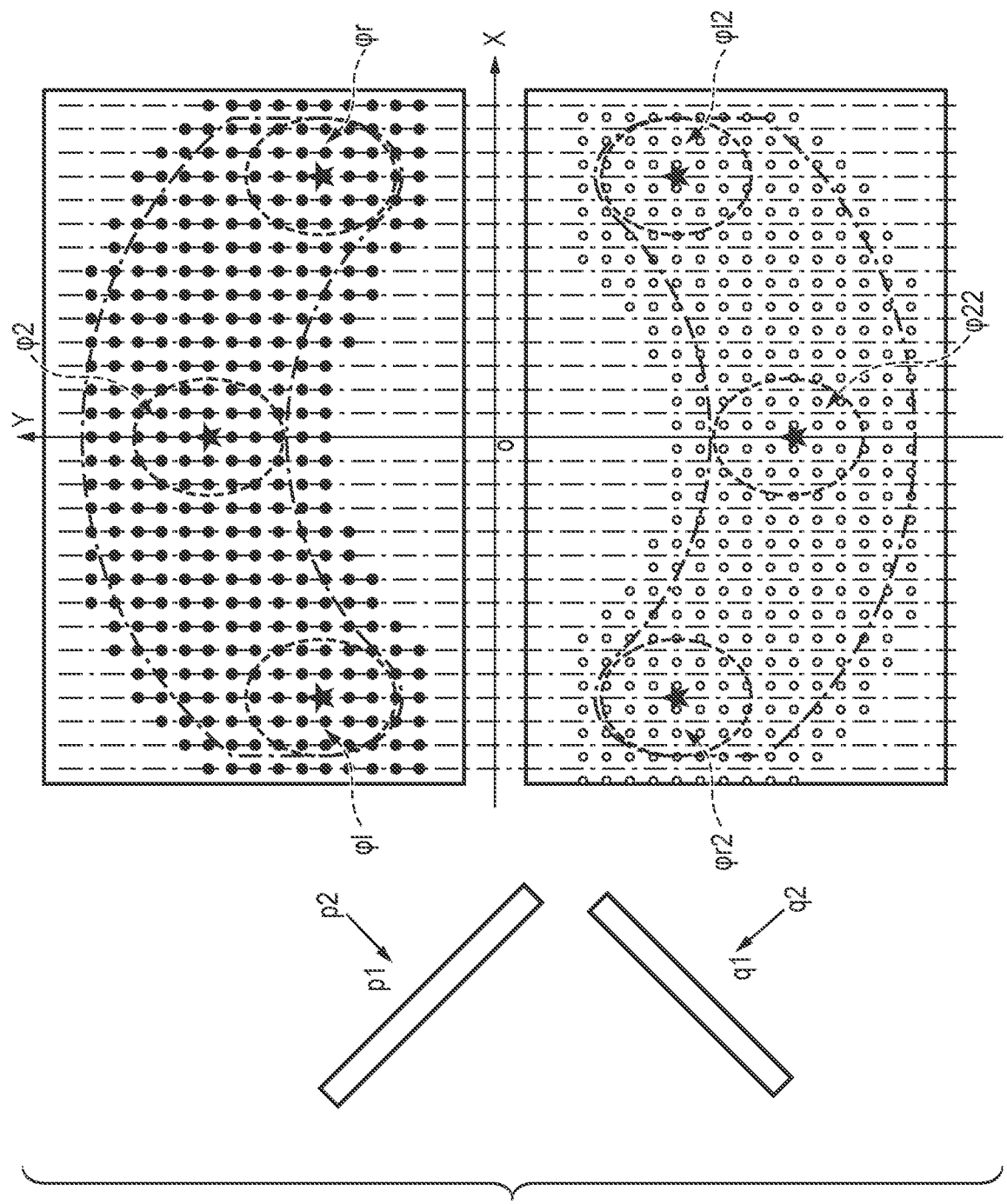
FIG. 12 is a view showing the positional relationship between the effective light flux areas and the correction points on plane mirrors in the third embodiment.

FIG. 12 is a view showing the relationship between the effective light flux areas and the correction points on the first and second plane mirrors in the third embodiment. In the surface of the first plane mirror T1 viewed from the tangential direction (the direction of p1p2 in FIG. 12), all the correction points (black points in FIG. 12) are arranged on a plurality of lines equally divided in the X direction. On the other hand, the acting points of the correction points of the second plane mirror T2 are set such that the acting points are arranged at positions shifted from the correction points of the first plane mirror T1 in a translation direction. For example, in the surface of the second plane mirror T2 viewed from the tangential direction (the direction of q1q2 in FIG. 12), all the correction points (white points in FIG. 12) are arranged at positions shifted from the lines equally divided in the X direction by half the pitch.

Figure 13:
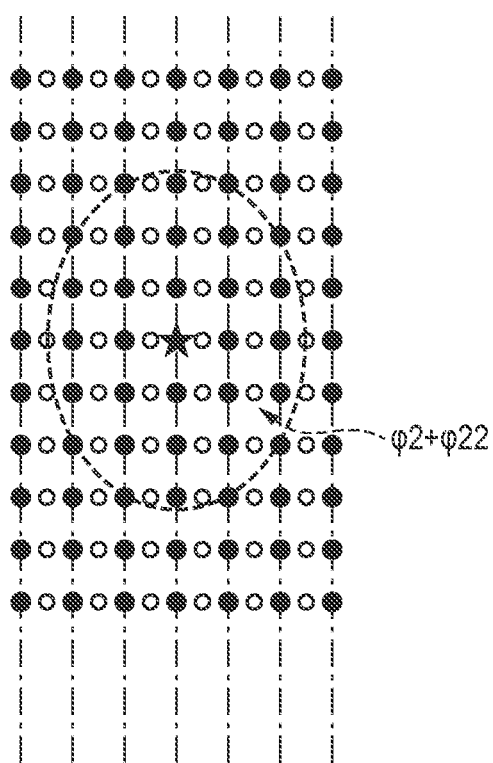
FIG. 13 is a view showing the array of effective correction points in one light flux in the third embodiment.

FIG. 13 is a view showing the array of effective correction points in one light flux in this embodiment. In FIG. 12, the light flux emitted from a point C2 on the mask forms φ2 and φ22 when reflected twice on the concave mirror Mo, and receives the action of the correction point groups existing in these areas. However, according to the arrangement shown in FIG. 12, the correction point groups in the two light fluxes are relatively shifted from each other in the X direction. Therefore, as shown in FIG. 13, the correction point groups substantially double the correction point group in the conventional example exist in the light flux reaching on the substrate, and the light flux receives the action thereof. A similar effect can be obtained for other points (R2 and L2) on the mask.

This embodiment is an example in which the correction points at the time of reflection for the second time are shifted in the X direction as the translation direction, but a similar effect can be obtained by shifting the correction points in the Y direction as the translation direction. Alternatively, the correction points may be shifted in both the X and Y directions.

Fourth Embodiment

Figure 14:
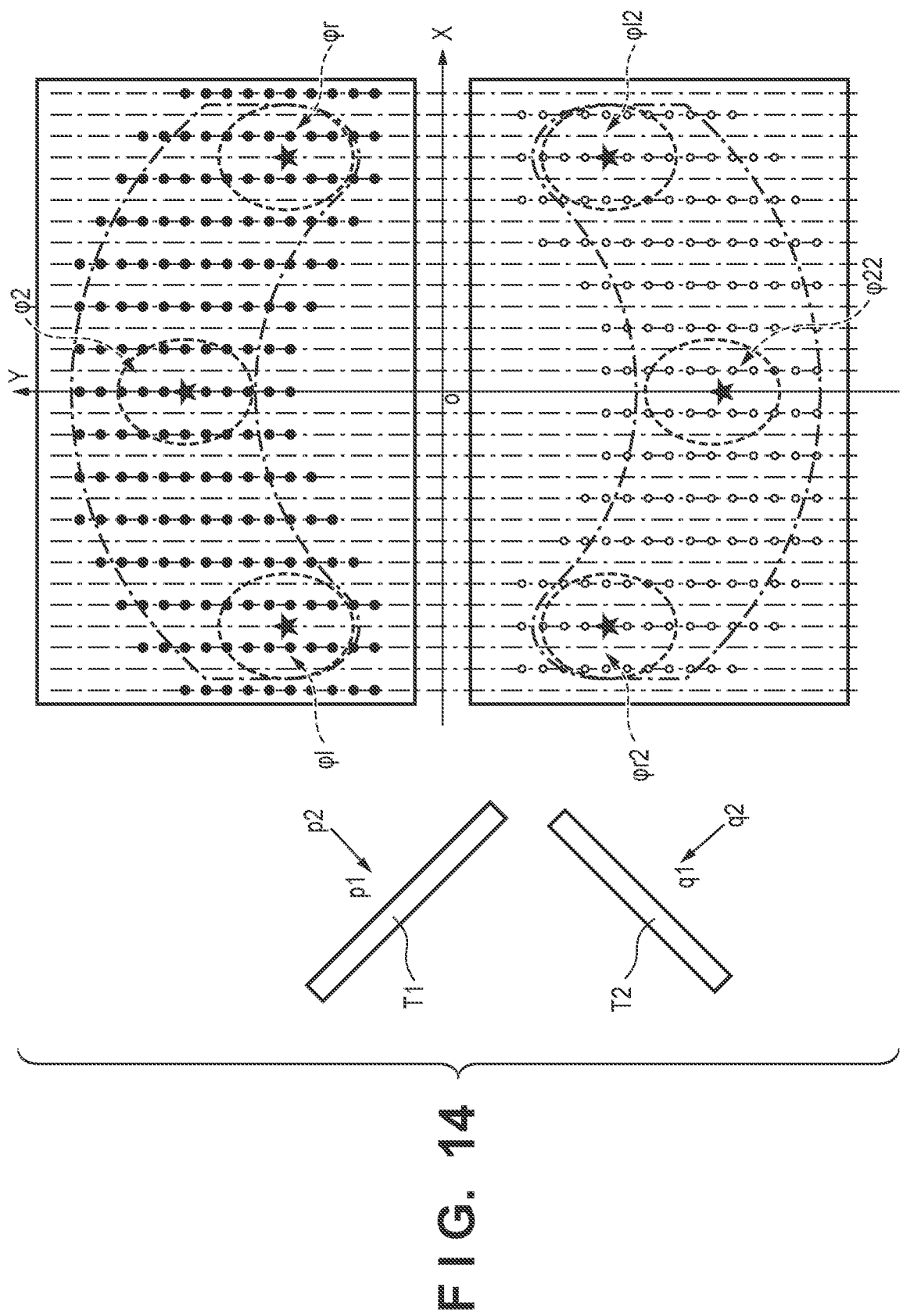
FIG. 14 is a view showing the positional relationship between the effective light flux areas and the correction points on the plane mirrors in the fourth embodiment.

Similar to the third embodiment, a first plane mirror T1 and a second plane mirror T2 are deformable mirrors in the fourth embodiment. FIG. 14 is a view showing the relationship between the effective light flux areas and the correction points on the first and second plane mirrors in the fourth embodiment. In FIG. 14, in the surface of the first plane mirror T1 viewed from the tangential direction (the direction of p1p2 FIG. 14), all the correction points (black points in FIG. 14) are arranged on every other line of a plurality of lines equally divided in the X direction. On the other hand, in the surface of the second plane mirror T2 viewed from the tangential direction (the direction of q1q2 in FIG. 14), all the correction points (white points in FIG. 14) are arranged on every other line, on which no black point is arranged, of the plurality of lines equally divided in the X direction.

Figure 15:
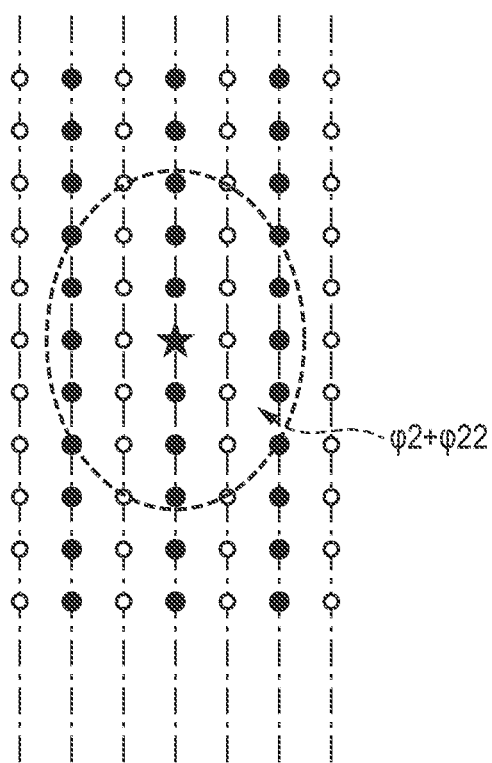
FIG. 15 is a view showing the array of effective correction points in one light flux in the fourth embodiment.

FIG. 15 is a view showing the array of effective correction points in one light flux in this embodiment. In FIG. 14, the light flux emitted from the point C2 on the mask forms $\varphi 2$ and $\varphi 22$ when reflected twice on a concave mirror Mo, and receives the action of the correction point groups existing in these areas. However, according to the arrangement shown in FIG. 14, the correction point groups in the two light fluxes are relatively shifted from each other in the X direction. Therefore, as shown in FIG. 15, substantially the same number of correction point groups as before thinning out exist in the light flux reaching on the substrate, and the light flux receives the action thereof. A similar effect can be obtained for the light fluxes emitted from other points (R2 and L2) on the mask.

With such the arrangement, the number of correction points of each plane mirror can be reduced to half. As a result, heat generated from the correction points can be reduced and air fluctuation caused by the heat during exposure can be suppressed, so that the image performance is stabilized. In addition, the effect of cost reduction is also large. This embodiment is an example in which the correction points at the time of reflection for the second time are shifted in the X direction, but a similar effect can be obtained by shifting the correction points in the Y direction. Alternatively, the correction points may be shifted in both the X and Y directions.

Fifth Embodiment

Figure 28:
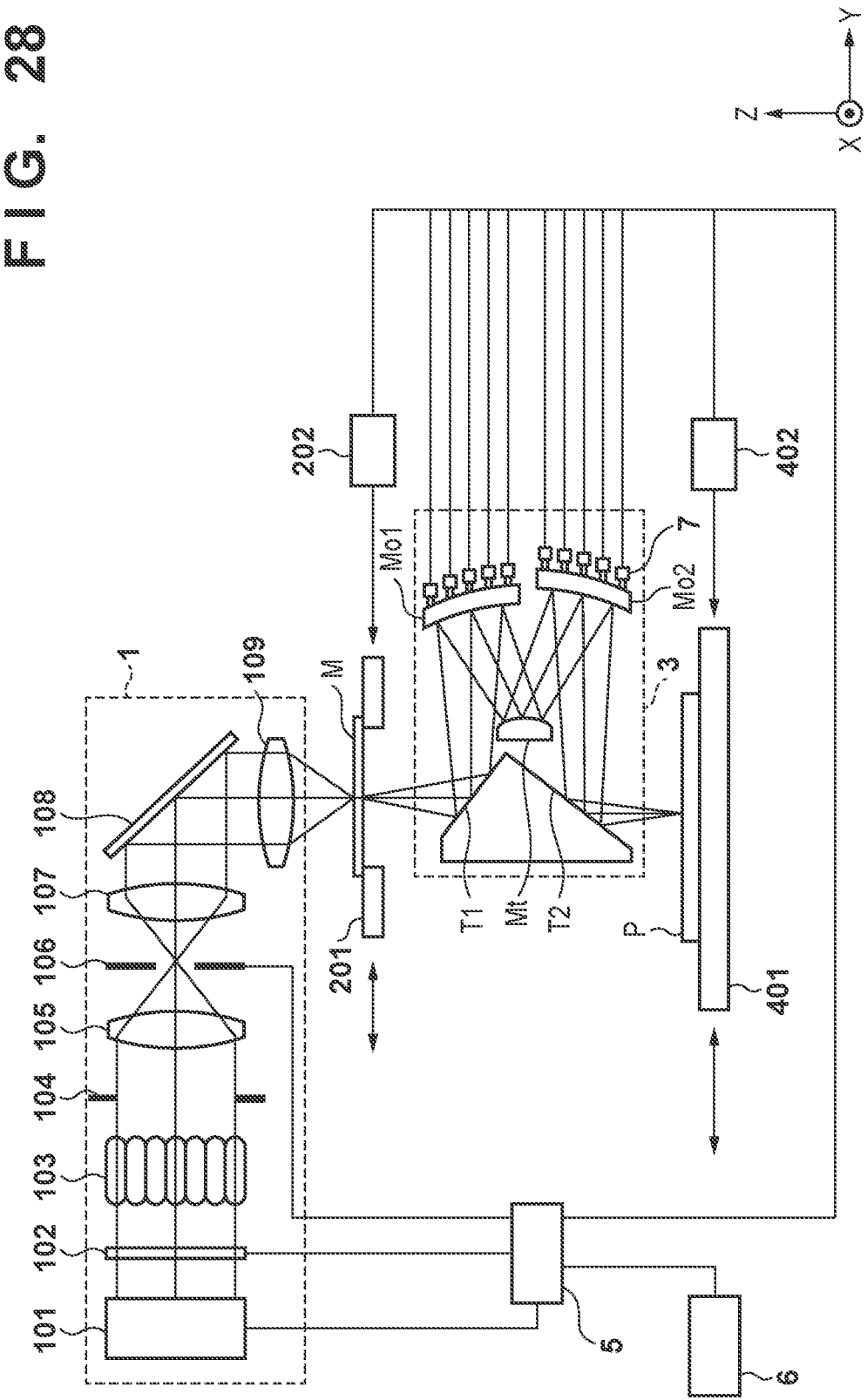
FIG. 28 is a view showing the arrangement of an exposure apparatus in the fifth embodiment.

FIG. 28 is a view showing the arrangement of the exposure apparatus in the fifth embodiment. FIG. 28 is different from FIG. 26 in that a projection optical system 3 is an enlargement system. In a case of the enlargement system, a concave mirror Mo is divided into a first concave mirror Mo1 and a second concave mirror Mo2, and they have different curvatures. A plurality of adjusters 7 are arranged on the rear surfaces of the first concave mirror Mo1 and the second concave mirror Mo2.

Figure 16:
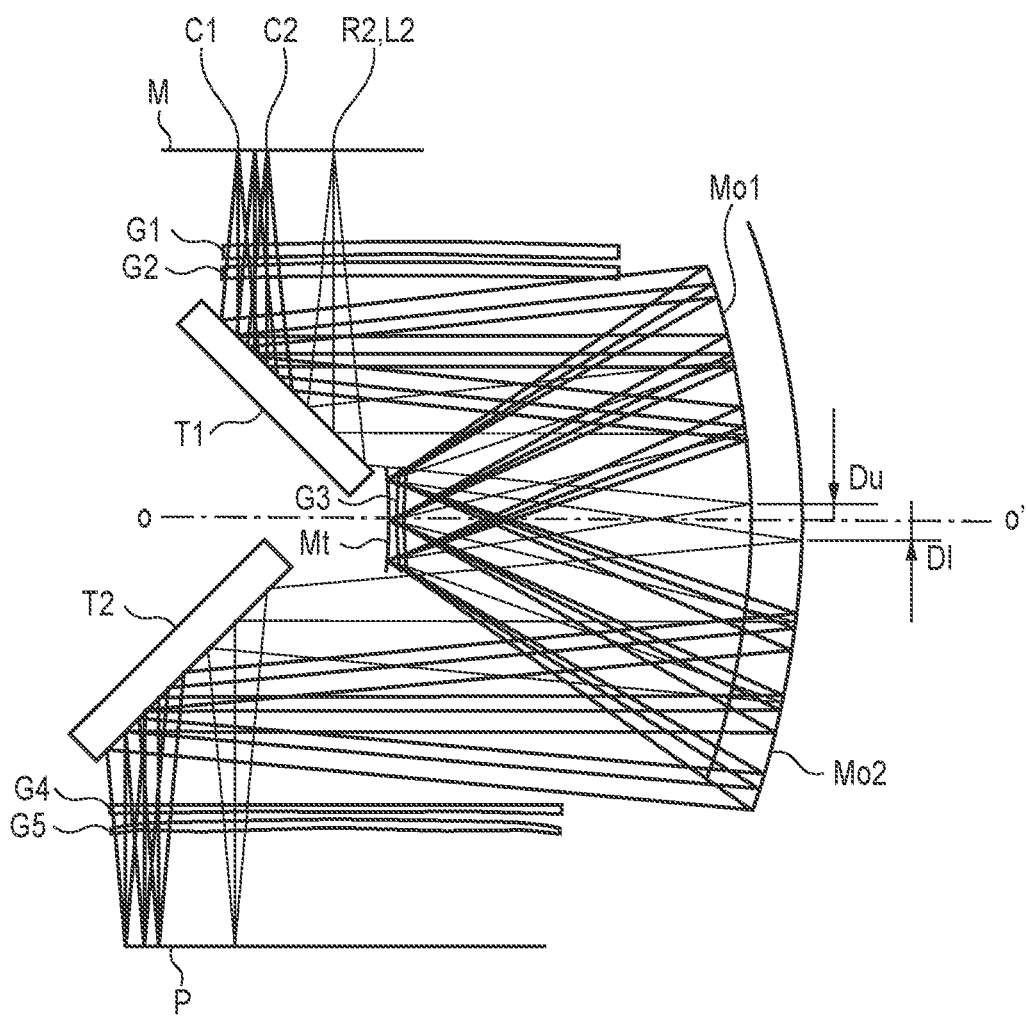
FIG. 16 is an optical path diagram of the projection optical system according to the fifth embodiment.

FIG. 16 is an optical path diagram of the projection optical system 3 in the fifth embodiment. As has been described above, the enlargement system is formed. The light fluxes emitted from points C1, C2, R2, and L2 shown on a mask surface M pass through optical members G1 and G2 immediately below the mask surface. After that, their optical paths are bent at a right angle by the action of a first plane mirror T1, and the light fluxes strike the first concave mirror Mo1. The positional relationship between the points C1, C2, R2, and L2 on the mask surface has been described with reference to FIG. 3. Each light flux reflected by the first concave mirror Mo1 passes through a refractive optical member G3 located in the vicinity of an optical axis oo', and then strikes a convex mirror Mt. The convex mirror Mt is located on the aperture plane of the imaging optical system. The light flux reflected by the convex mirror Mt passes through the refractive optical member G3 again, and then strikes the second concave mirror Mo2. The light flux reflected by the second concave mirror Mo2 travels to a second plane mirror T2, and its optical path is bent at a right angle by the action of the second plane mirror T2. The light flux passes through optical members G4 and G5 immediately above a substrate P, and is imaged on the substrate P. Each of the above-described optical members G1 and G2 arranged in the vicinity of the mask and the above-described optical members G4 and G5 arranged in the vicinity of the substrate is an optical member having a refractive power, and can include, for example, a lens having an aspherical shape.

In FIG. 16, a distance Du between the optical axis oo' and the point of the light flux emitted from each of the points R2 and L2 on the mask surface, the point being closest to the optical axis oo' on the first concave mirror Mo1, and a distance D1 between the optical axis oo' and the point thereof closest to the optical axis oo' on the second concave mirror Mo2 are shown. The values of the distances Du and D1 correspond to the value of a distance D shown in FIG. 7. However, since the optical system shown in FIG. 7 is the equal-magnification system but the optical system shown in FIG. 16 is the enlargement system, EA1 and EA2 shown in FIG. 7 are not equal to each other in FIG. 16. Hence, Du and D1 have different values. In this embodiment, the imaging magnification is ×1.15, the numerical aperture (NA) is 0.105, and the exposure width is 750 mm. All of them are the values on the mask surface. As the exposure wavelength, the i-line, the h-line, or the g-line is used, and aberration correction is performed thereon. A curvature radius R of each optical member, the distance D, an optical refractive index N of a glass member, and the reference symbols of the corresponding optical members for implementing the above-described configuration are summarized in Table 3 below. Note that each of some optical members is formed to have an aspherical surface, and an equation for defining the aspherical shape is given by equation 1 described above. Examples of respective coefficients are shown in Table 4 below.

TABLE 3

| Surface Number | | R | D | N | |
|---|---|---|---|---|---|
| Object | | 0 | 0 | | |
| 1 | | 0 | 238.84 | | |
| 2 | Aspheric surface | −54898.86 | 40 | 'Sio2' | G1 |
| 3 | Aspheric surface | 7471.85 | 12.31 | | |
| 4 | | 8150.22 | 24.9 | 'Sio2' | G2 |
| 5 | | 10323.54 | 10 | | |
| 6 | | 0 | 20 | | |
| 7 | | 0 | 15 | | |
| 8 | | 0 | 20 | | |
| 9 | | 0 | 0 | | |
| 10 | | 0 | 598.58 | | |
| 11 | | 0 | −917.57 | Reflective | T1 |
| 12 | Aspheric surface | 2020.34 | 927.23 | Reflective | Mo1 |
| 13 | | 0 | 0 | | |

TABLE 3-continued

| Surface Number | R | D | N | |
|---|---|---|---|---|
| 14 | 0 | 0 | | |
| 15 | −2601.28 | 31.41 | 'Sio2' | G3 |
| 16 | −2384.46 | 35.04 | | |
| 17 | Aspheric surface 1125.61 | −35.04 | Reflective | Mt |
| 18 | −2384.46 | −31.41 | 'Sio2' | G3 |
| 19 | −2601.28 | 0 | | |
| 20 | 0 | 0 | | |
| 21 | 0 | −1064.75 | | |
| 22 | Aspheric surface 2308.58 | 1283.51 | Reflective | Mo2 |
| 23 | 0 | −753.47 | Reflective | T2 |
| 24 | 0 | −20 | | |
| 25 | 0 | −15 | | |
| 26 | 0 | −20 | | |
| 27 | 0 | −15 | | |
| 28 | 0 | −33.9 | 'Sio2' | G4 |
| 29 | Aspheric surface 4950.65 | −10 | | |
| 30 | −29328.69 | −10.77 | 'Sio2' | G5 |
| 31 | Aspheric surface −2922.19 | −268.68 | | |
| 32 Image plane | 0 | 0 | | |

TABLE 4

Aspheric Surface Data

| Surface Number | K | A | B | C | D |
|---|---|---|---|---|---|
| 2 | 0.00E+00 | 2.03E−09 | −1.34E−14 | 1.75E−20 | 7.58E−26 |
| 3 | 0.00E+00 | 3.19E−10 | −2.72E−15 | 2.94E−21 | −1.33E−26 |
| 12 | 0.00E+00 | 1.25E−12 | 1.56E−18 | −5.50E−24 | −1.57E−31 |
| 17 | 0.00E+00 | 2.57E−11 | 2.40E−16 | 7.44E−24 | −2.79E−23 |
| 22 | 0.00E+00 | 2.53E−13 | −1.86E−18 | 6.47E−24 | −1.85E29 |
| 29 | 0.00E+00 | −1.89E−10 | −5.63E−16 | 2.59E−21 | 7.81E−28 |
| 31 | 0.00E+00 | 7.07E−10 | −8.59E−16 | −4.88E−22 | −7.78E−27 |

| Surface Number | E | F | G | H | J |
|---|---|---|---|---|---|
| 2 | −1.05E−31 | −9.89E−37 | 3.29E−42 | −2.60E−48 | 0.00E+00 |
| 3 | 1.13E−31 | −2.24E−38 | −1.17E−42 | 2.34E−48 | 0.00E+00 |
| 24 | 1.06E−28 | −1.30E−33 | 6.48E−39 | 0.00E+00 | 0.00E+00 |
| 41 | −7.85E−32 | 8.15E−38 | −2.60E−44 | 0.00E+00 | 0.00E+00 |
| 42 | 1.31E−32 | −3.76E−38 | 4.28E−44 | 0.00E+00 | 0.00E+00 |

FIG. 17A is a schematic view showing the relationship between the effective light flux area and the correction points on the first concave mirror in the fifth embodiment, and FIG. 17B is a schematic view showing the relationship between the effective light flux area and the correction points on the second concave mirror in the fifth embodiment. The Y-axis in each of FIGS. 17A and 17B corresponds to the Z-axis in FIG. 16. The positional relationship between the correction points in FIG. 17A and the correction points in FIG. 17B is similar to the relationship shown in FIG. 10 in which the correction points are shifted in the circumferential direction. However, since the optical system is the enlargement system in this embodiment, the first concave mirror Mo1 and the second concave mirror Mo2 have different curvature radii and effective light flux diameters. That is, the size of φ2 in FIG. 17A is different from the size of φ22 in FIG. 17B. Similarly, φr and φr2 have different sizes, and φ1 and φ12 have different sizes. In general, the enlargement ratio of the optical system or a predetermined proportional relationship exists between the light flux diameters, and the corresponding light fluxes have similar shapes.

FIG. 18 is a view showing the array of effective correction points in one light flux in this embodiment. According to the above-described relationship between the light fluxes, as shown in FIG. 18, substantially double the number of correction point groups in the circumferential direction exist in the light flux reaching on the substrate, and the light flux receives the action thereof. A similar effect can be obtained for the light fluxes emitted from the other points (R2 and L2) on the mask.

Sixth Embodiment

Figure 29:
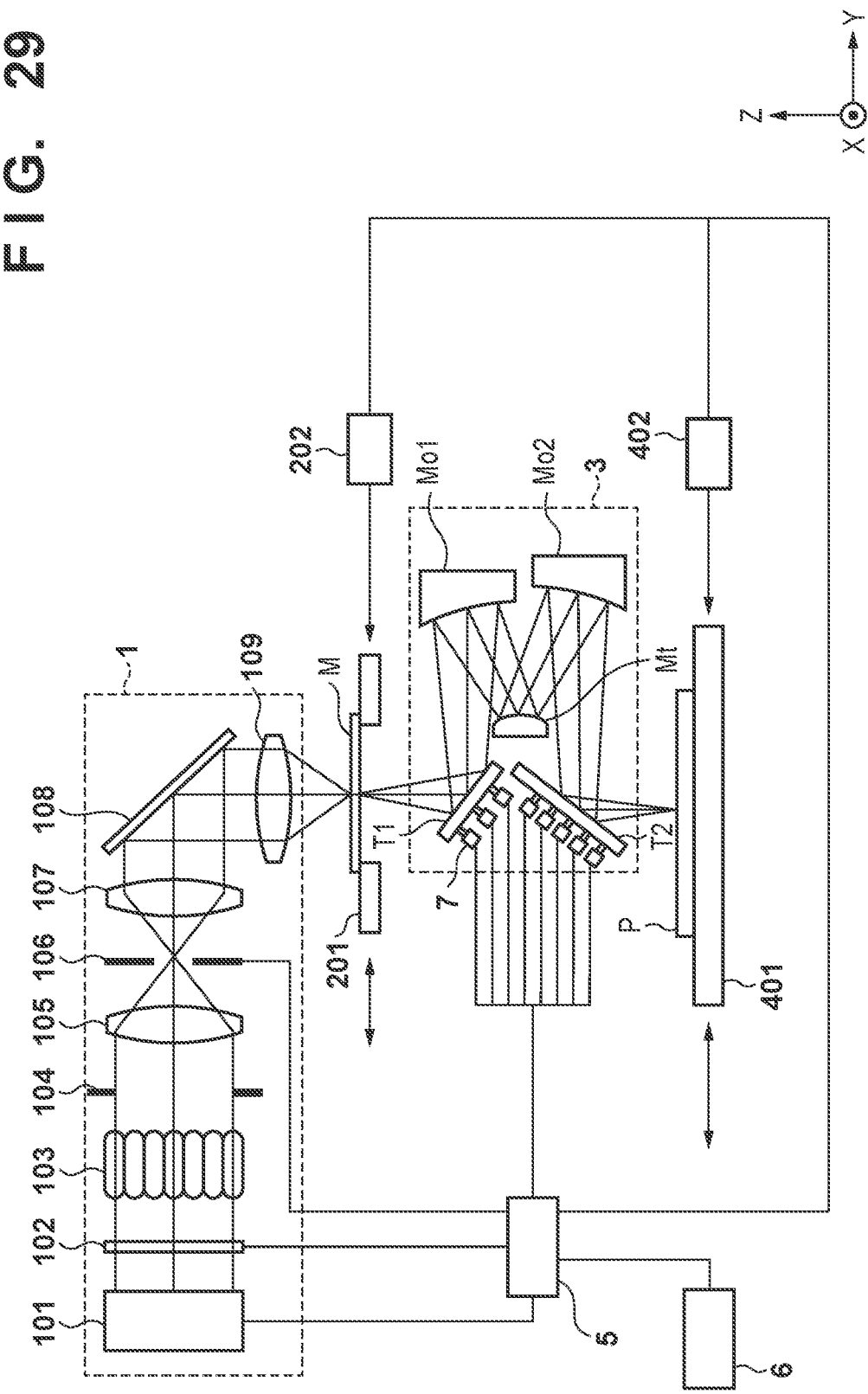
FIG. 29 is a view showing the arrangement of an exposure apparatus in the sixth embodiment.

FIG. 29 is a view showing the arrangement of the exposure apparatus in the sixth embodiment. FIG. 29 is different from FIG. 28 in that not a first concave mirror Mo1 and a second concave mirror Mo2 but a first plane mirror T1 and a second plane mirror T2 are deformable mirrors. Therefore, a plurality of adjusters 7 are arranged on the rear surfaces of the first plane mirror T1 and the second plane mirror T2.

Figure 19A:
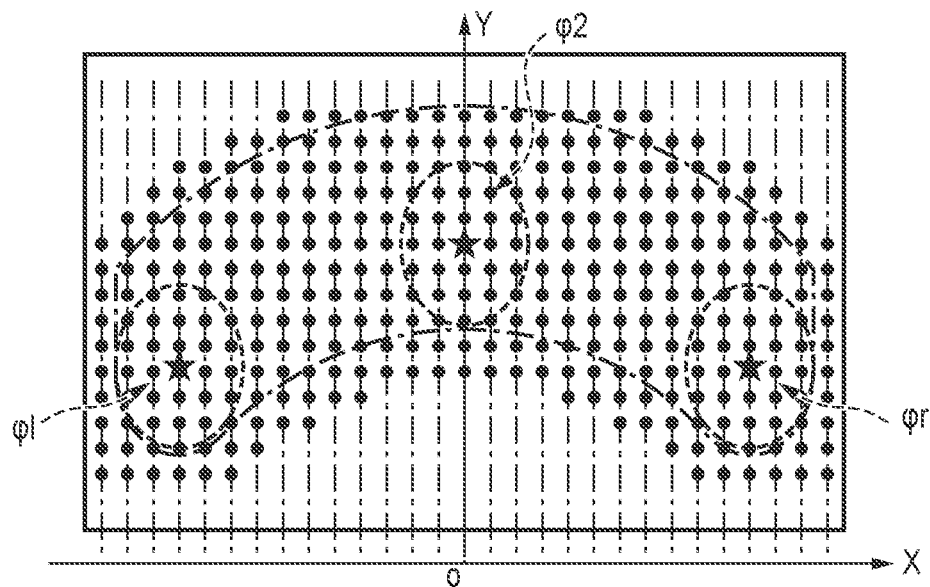
FIGS. 19A and 19B are schematic views showing the positional relationship between the effective light flux area and the correction points on the first and second plane mirrors, respectively, in the sixth embodiment.
Figure 19B:
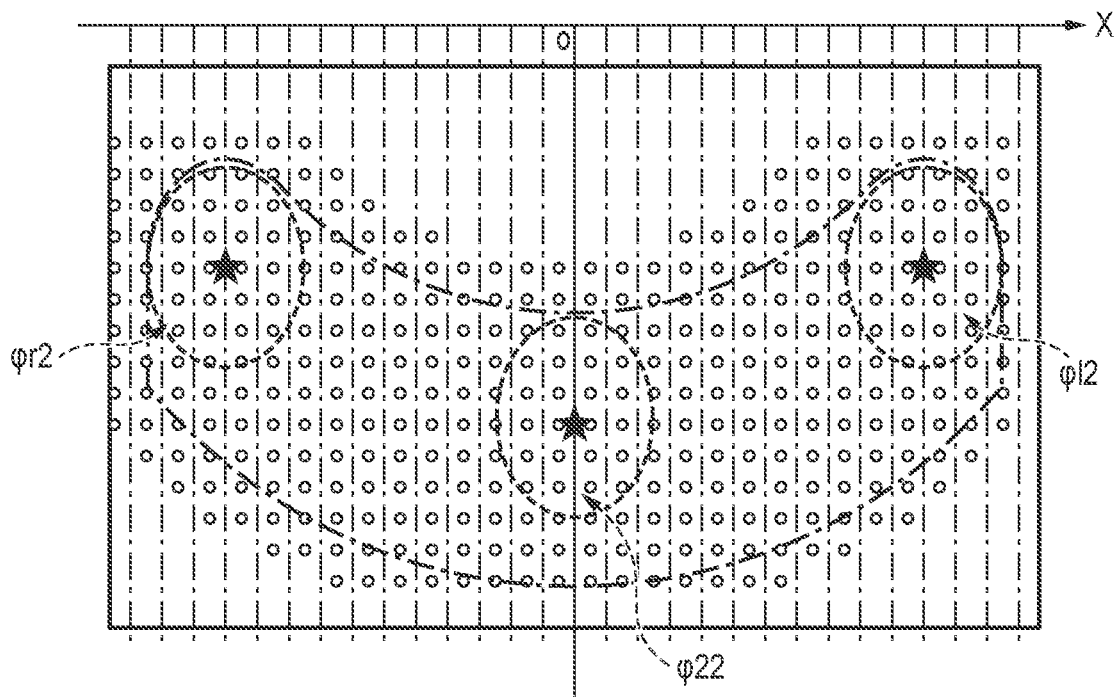

FIG. 19A is a schematic view showing the relationship between the effective light flux area and the correction points on the first plane mirror T1 in the sixth embodiment, and FIG. 19B is a schematic view showing the relationship between the effective light flux area and the correction points on the second plane mirror T2 in the sixth embodiment. The positional relationship between the correction points in FIG. 19A and the correction points in FIG. 19B is similar to the relationship shown in FIG. 12 in which the correction points are shifted in the X direction. However, since the optical system is the enlargement system in this embodiment, the diameter of the effective light flux (φ2) on the first plane mirror T1 is different from the diameter of the effective light flux (φ22) on the second plane mirror T2. Similarly, φr and φr2 have different diameters, and φ1 and φ12 have different diameters. In general, the enlargement ratio of the optical system or a predetermined proportional relationship exists between the light flux diameters, and the corresponding light fluxes have similar shapes.

Figure 20:
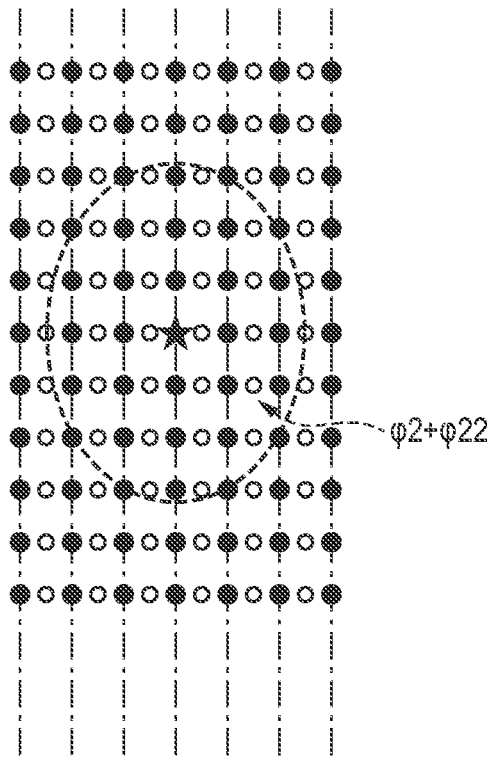
FIG. 20 is a view showing the array of effective correction points in one light flux in the sixth embodiment.

FIG. 20 is a view showing the array of effective correction points in one light flux in this embodiment. According to the relationship described above, as shown in FIG. 20, substantially double the number of correction point groups in the X direction exist in the light flux reaching on the substrate, and the light flux receives the action thereof. A similar effect can be obtained for the light fluxes emitted from the other points (R2 and L2) on the mask.

This embodiment is an example in which the correction points at the time of reflection for the second time are shifted in the X direction, but similar effect can be obtained by shifting the correctio points in the Y direction. Alternatively, the correction points may be shifted in both the X and Y directions.

Note that the enlargement projection optical system is exemplified in each of the fifth embodiment and the sixth embodiment, but the present invention can be similarly applied to a reduction projection optical system.

Seventh Embodiment

Figure 30:
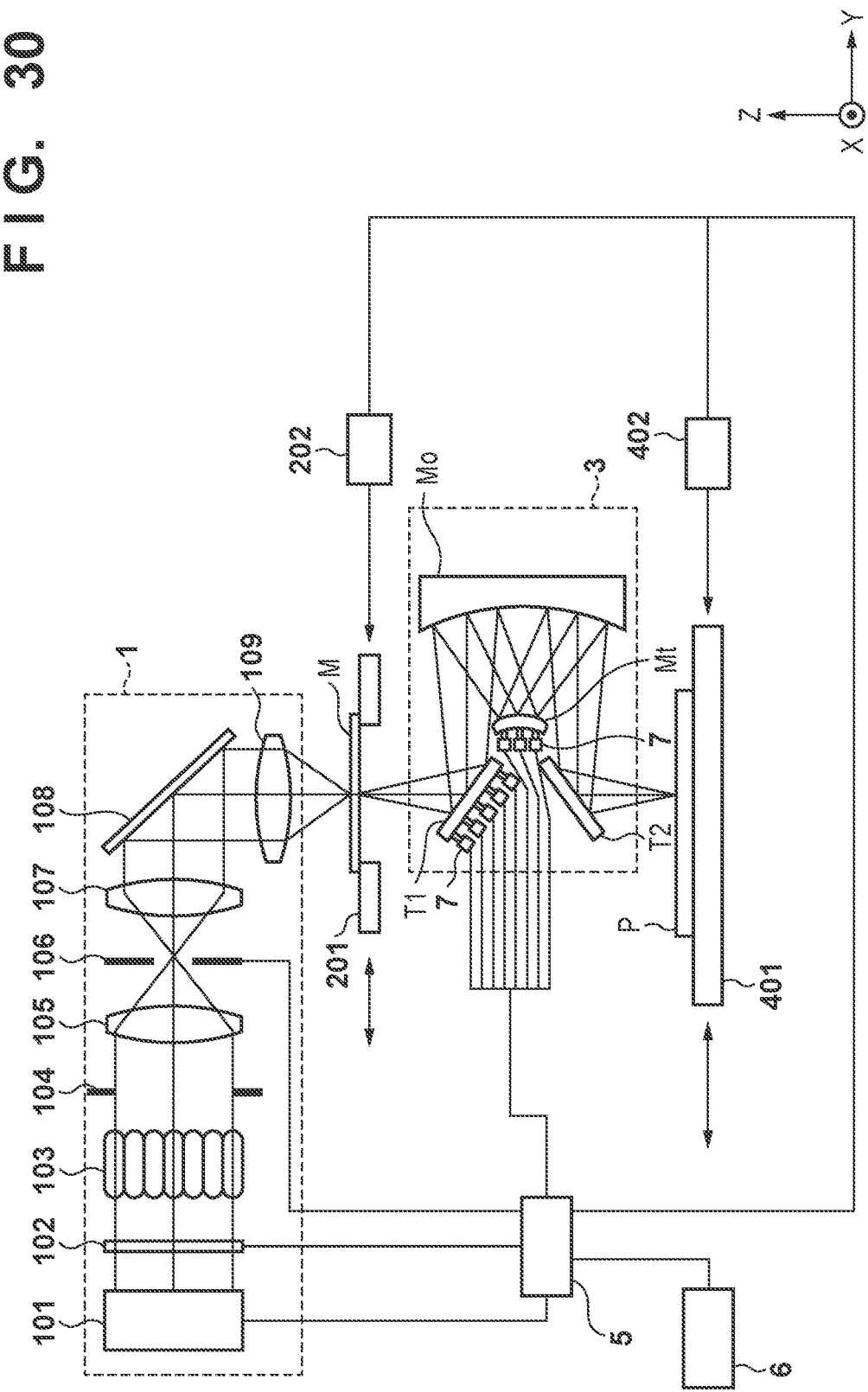
FIG. 30 is a view showing the arrangement of an exposure apparatus in the seventh embodiment.

FIG. 30 is a view showing the arrangement of the exposure apparatus in the seventh embodiment. FIG. 30 is different from FIG. 26 in that not a concave mirror Mo but a first plane mirror T1 and a convex mirror Mt are deformable mirrors. Therefore, a plurality of adjusters 7 are arranged on the rear surfaces of the first plane mirror T1 and the convex mirror Mt.

In this embodiment, points obtained by projecting the force acting points of the plurality of adjusters 7 on the first plane mirror T1 in a direction orthogonal to the first plane mirror T1 and points obtained by projecting the force acting points of the plurality of adjusters 7 on the convex mirror Mt in a direction parallel to the optical axis of the convex mirror Mt are defined as the correction points.

In this embodiment, the force acting points of the plurality of adjusters 7 are set such that following two conditions (a) and (b) are satisfied when a first ray and a second ray in the light flux emitted from one point on the mask are reflected by the first plane mirror T1 and the convex mirror Mt.

(a) The first ray strikes the correction point of the first plane mirror T1, but does not strike the correction point of the convex mirror Mt.

(b) The second ray does not strike the correction point of the first plane mirror T1, but strikes the correction point of the convex mirror Mt.

Here, consider superimposition of the areas and positions including:

(1) the first effective light flux area which is the effective light flux area of the first plane mirror T1;
(2) the positions of the force acting points of the plurality of adjusters 7 projected in the first effective light flux area;
(3) the second effective light flux area which is the effective light flux area of the convex mirror Mt; and
(4) the positions of the force acting points of the plurality of adjusters 7 projected in the second effective light flux area.

In one example, the plurality of adjusters 7 are arranged such that when the superimposition is performed, the positions of the force acting points of the plurality of adjusters 7 projected in the first effective light flux area are different from the positions of the force acting points of the plurality of adjusters 7 projected in the second effective light flux area. A specific example of such setting of the acting points (adjustment points) will be described below with reference to FIGS. 21 to 23.

Figure 21:
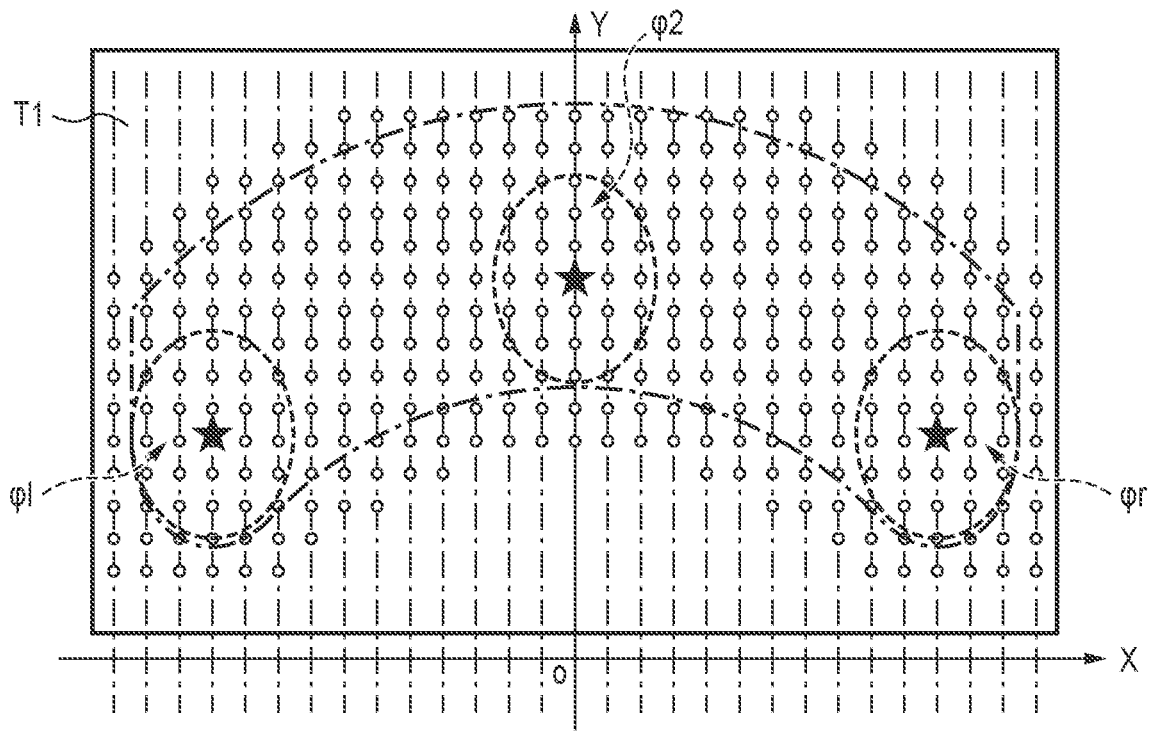
FIG. 21 is a view showing the positional relationship between the effective light flux area and the correction points on the first plane mirror in the seventh embodiment.
Figure 22:
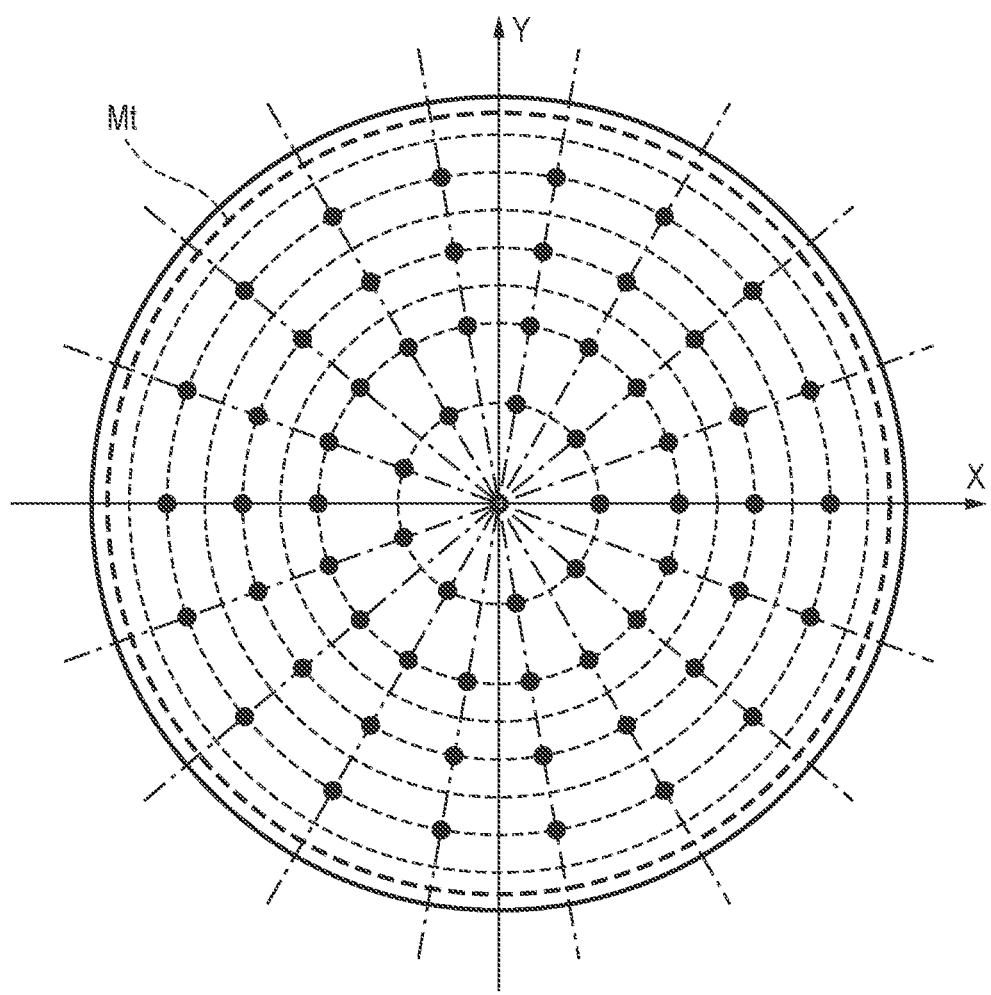
FIG. 22 is a view showing the positional relationship between the effective light flux area and the correction points on a convex mirror in the seventh embodiment.

FIG. 21 is a schematic view showing the relationship between the effective light flux area and the correction points on the first plane mirror T1, and FIG. 22 is a schematic view showing the relationship between the effective light flux area and the correction points on the convex mirror Mt. FIG. 21 is substantially the same as FIG. 19A, but in FIG. 22, almost the entire surface (the area indicated by the dashed line on the outermost circumference) of the convex mirror Mt is the effective light flux area. This is because the convex mirror Mt is located on the aperture plane of the overall optical system.

Figure 23:
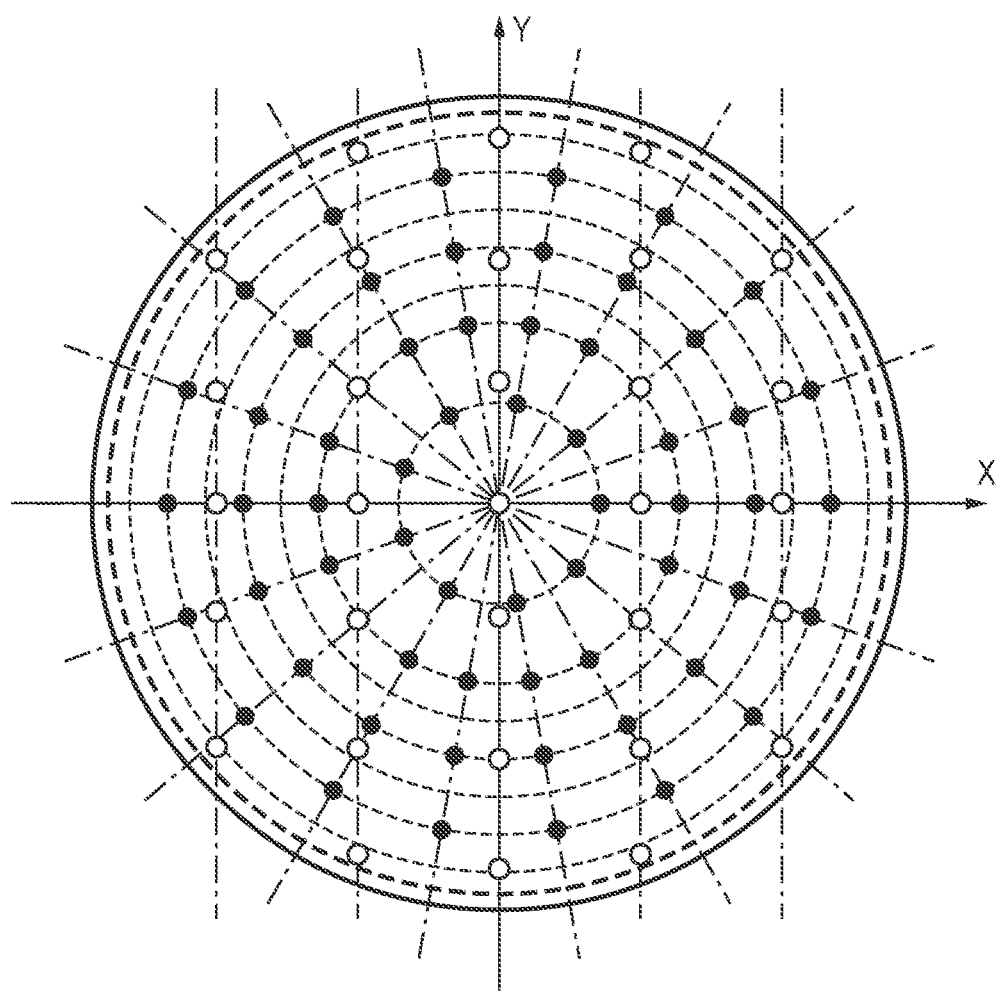
FIG. 23 is a view showing the array of effective correction points in one light flux in the seventh embodiment.

FIG. 23 is a view showing the array of effective correction points in one light flux in this embodiment. In FIG. 23, the correction point group on the convex mirror Mt is indicated by rotationally symmetrically arrayed black points, and the correction point group on the first plane mirror T1 is indicated by white points arrayed in the Y-axis direction. Since the black points and the white points are located at different positions in the light flux, it can be considered that an increase in the number of correction points has been achieved, which is the object of the present invention. The black points and the white points overlap in some portions, but this is not contradictory to the present invention.

A similar effect can be obtained for the light fluxes emitted from other points (R2 and L2) on the mask. In this embodiment, it is possible to correct not only the rotationally symmetric aberration but also the aberration that changes in one dimension.

Eighth Embodiment

Figure 24:
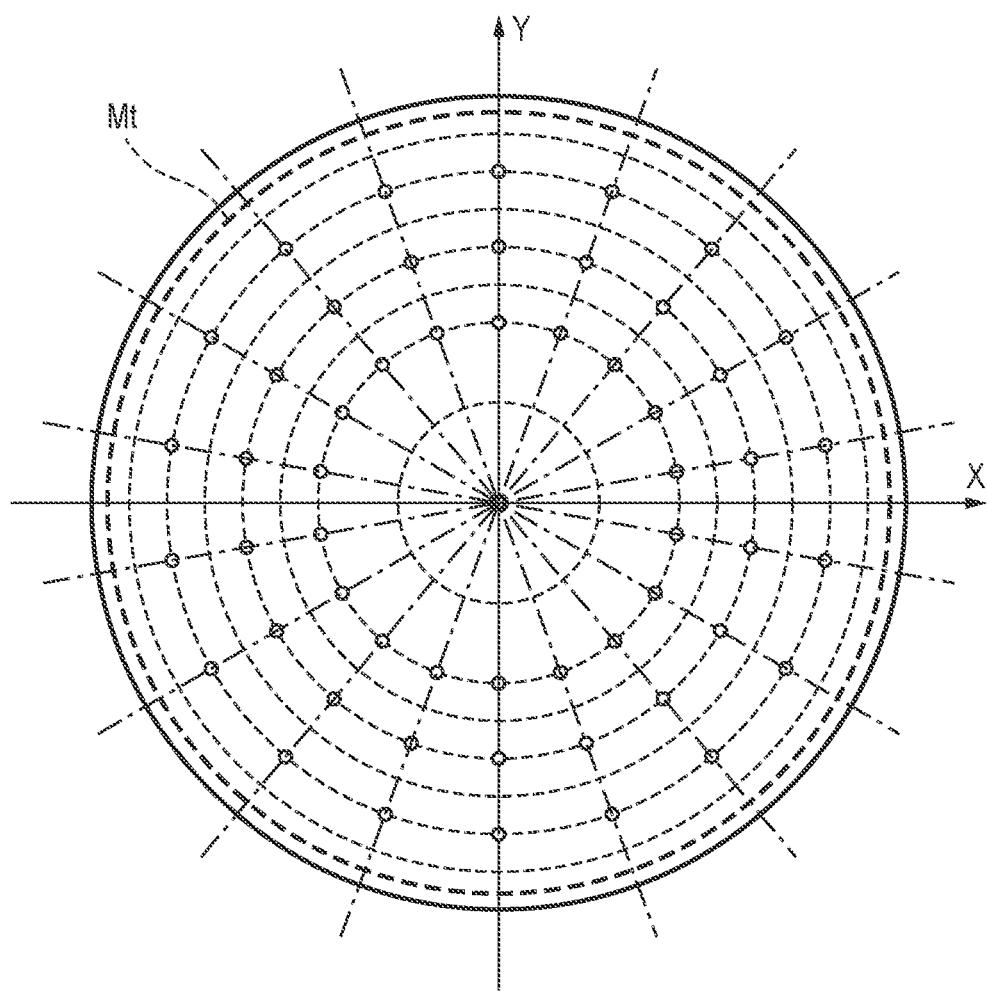
FIG. 24 is a view showing the positional relationship between the effective light flux area and the correction points on the convex mirror in the eighth embodiment.
Figure 25:
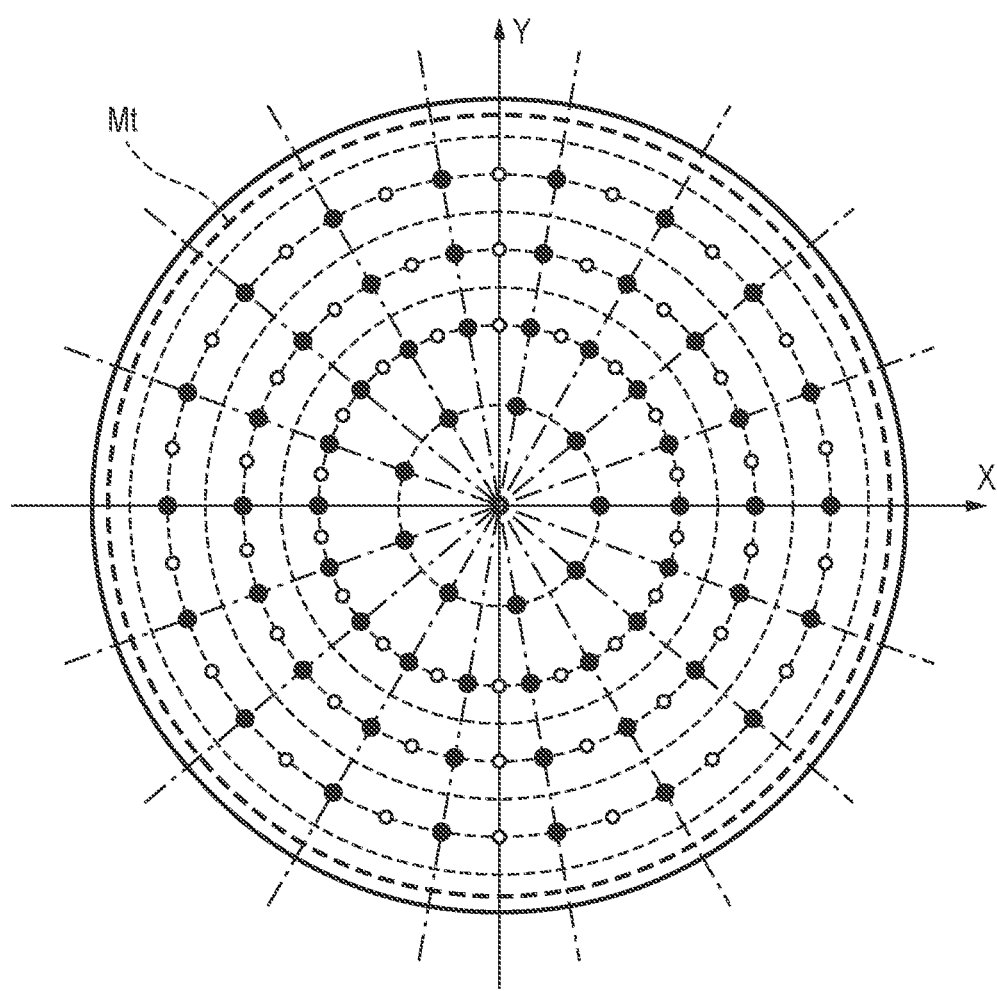
FIG. 25 is a view showing the array of effective correction points in one light flux in the eighth embodiment.

FIG. 24 shows an example according to the eighth embodiment, in which the present invention is applied to the aperture plane of an optical system that includes an intermediate imaging plane and a plurality of aperture planes arranged before and after the intermediate imaging plane as disclosed in Japanese Patent No. 3724517. The correction point group shown in FIG. 22 is arranged on the first aperture plane, and the correction point group shown in FIG. 24 is arranged on the second aperture plane. The correction point group shown in FIG. 24 is obtained by rotating the correction point group shown in FIG. 22 in the circumferential direction by half the pitch. FIG. 25 shows the array of effective correction points in one light flux formed by these correction point groups.

In this embodiment, both of the two surfaces formed by the deformable mirrors are the aperture planes. Hence, optically, the aberration (focus, astigmatism, coma, or the like) common to the entire screen can be corrected with high accuracy. In addition, the optical system to which this embodiment is applied is not limited to a type in which a Dyson optical system is connected as in Japanese Patent No. 3724517. For example, the present invention is also applicable to a case in which an optical system is formed by connecting two concave and convex mirrors as shown in FIG. 1 in series as in FIG. 1, and the convex mirror is formed from two convex mirrors Mt of deformable mirrors.

(Summary)

Various embodiments have been described above. Note that the above-described embodiments may be combined as appropriate. These embodiments can be comprehensively summarized as follows. In each of the above-described embodiments, there is shown an imaging optical system that includes a plurality of mirrors each including a reflecting surface which reflects light and a rear surface on the opposite side of the reflecting surface, and images a light flux emitted from the object plane on the image plane via the reflecting surfaces of the plurality of mirrors. The imaging optical system includes a plurality of adjusters that adjust the shape of the reflecting surface of each of at least two mirrors of the plurality of mirrors by applying a force to the rear surface of each of the at least two mirrors. Here, points obtained by projecting the force acting points of the plurality of adjusters in the optical axis direction defined with respect to the reflecting surface are defined as the correction points. At this time, when the first ray and the second ray in the light flux emitted from one point on the object plane are reflected by the first reflecting surface and the second reflecting surface, the first ray strikes the correction point of the first reflecting surface, but does not strike the correction point of the second reflecting surface. In addition, the second ray does not strike the correction point of the first reflecting surface, but strikes the correction point of the second reflecting surface. The acting points of the plurality of adjusters are set to implement this.

According to the above-described embodiments, the more effective arrangement of the surface-shape correction point array with respect to the light flux is implemented. With this arrangement, even if the number of correction points is the same as in a case in which the correction points are point-symmetrically arranged on the reflecting surface, optically, it is possible to perform aberration correction on one light flux using a larger number of correction points. The aberration correction accuracy is improved accordingly.

Alternatively, even if the number of correction points is smaller, it is possible to perform aberration correction on one light flux using the number of the correction points equal to the number of the point-symmetrically arranged correction points as in the conventional example. Since the number of correction points can be reduced accordingly, heat generated at the time of driving is distributed, so that the correction accuracy is improved and stabilized.

Further, as shown in each embodiment, the present invention is applicable to an arbitrary reflecting surface including the aperture plane. Therefore, it is possible to correct not only uniform aberration in a screen but also focus or astigmatism that varies in the screen. It is also possible to correct the magnification and distortion. Further, when a large exposure area is collectively exposed, the high focus accuracy and the high positioning accuracy can be ensured.

Owing to the above-described effects, the high resolution is maintained during exposure, and it becomes possible to expose high-resolution panels with high productivity.

<Embodiment of Article Manufacturing Method>

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described exposure apparatus on a photosensitive agent applied on a substrate (a step of exposing the substrate), and a step of developing the substrate on which the latent pattern has been formed in the above step. In addition, the manufacturing method includes other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-119449, filed Jul. 10, 2020, which is hereby incorporated by reference herein in its entirety.

What is claimed is:

1. An imaging optical system comprising:
a plurality of reflecting surfaces that reflect light, and image a light flux emitted from an object plane on an image plane, the plurality of reflecting surfaces including at least a first concave reflecting surface, a convex surface, and a second concave reflecting surface, wherein light is reflected by the first concave surface, the convex surface, and the second concave surface, in this order; and
a plurality of adjusters configured to adjust a shape of each of the first and second concave reflecting surfaces by applying a force to a rear surface of each of the first and second concave reflecting surfaces,
wherein, in a state where correction points are obtained by projecting force acting points of the plurality of adjusters in an optical axis direction defined with respect to the first and second concave reflecting surfaces, the force acting points are set so that, among a first ray in a light flux emitted from a first point on the object plane and a second ray in the light flux emitted from a second point on the object plane different from the first point, and respectively reflected by the first concave reflecting surface and the second concave reflecting surface:
the first ray strikes the correction points of the first concave reflecting surface but does not strike the correction points of the second concave reflecting surface; and
the second ray does not strike the correction points of the first concave reflecting surface but strikes the correction points of the second concave reflecting surface, and
wherein the force acting points are set so that the correction points of the second concave surface are arranged at at least one of:
positions shifted from the correction points of the first concave surface in a radial direction centered on the optical axis; or
positions shifted from the correction points of the first concave surface in a circumferential direction centered on the optical axis.

2. An exposure apparatus for exposing a substrate while scanning a mask and the substrate, the exposure apparatus comprising:
a projection optical system including:
a first plane surface;
a first concave surface;
a convex surface;
a second concave surface;
a second plane surface; and
a plurality of adjusters configured to adjust a shape of each of the first concave surface and the second concave surface by applying a force to a rear surface of each of the first concave surface and the second concave surface,
wherein the projection optical system is configured to:
project a pattern of the mask onto the substrate; and
cause light transmitted through the pattern of the mask to be reflected by the first plane surface, the first concave surface, the convex surface, the second concave surface, and the second plane surface, in this order,
wherein, in a state where corrections points are obtained by projecting force acting points of the plurality of adjusters on the first concave surface and the second concave surface in a direction parallel to an optical axis of the convex surface, the force acting points are set so that, among a first ray in a light flux emitted from a first point on the mask and a second ray in the light flux emitted from a second point on the mask different from the first point, and respectively reflected by the first concave surface and the second concave surface:

the first ray strikes the correction points of the first concave surface but does not strike the correction points of the second concave surface; and the second ray does not strike the correction points of the first concave surface but strikes the correction points of the second concave surface, and wherein the force acting points are set so that the correction points of the second concave surface are arranged at one of:

positions shifted from the correction points of the first concave surface in a radial direction centered on the optical axis; or positions shifted from the correction points of the first concave surface in a circumferential direction centered on the optical axis.

3. The apparatus according to claim 2, wherein the projection optical system is an enlargement system.

4. The apparatus according to claim 2, wherein the projection optical system is a reduction system.

5. The apparatus according to claim 2, wherein the projection optical system includes optical members each having a refractive power and arranged in the vicinity of the mask and in the vicinity of the substrate, respectively, and the optical member includes a lens having an aspherical shape.

6. An exposure apparatus for exposing a substrate while scanning a mask and the substrate, the exposure apparatus comprising:

a projection optical system including:
a first plane surface;
a first concave surface;
a convex surface;
a second concave surface;
a second plane surface; and
a plurality of adjusters configured to adjust a shape of each of the first plane surface and the second plane surface by apply a force to a rear surface of each of the first plane surface and the second plane surface, wherein the projection optical system is configured to:
project a pattern of the mask onto the substrate; and
cause light transmitted through the pattern of the mask to be reflected by the first plane surface, the first concave surface, the convex surface, the second concave surface, and the second plane surface, in this order, wherein, in a state where correction points are obtained by projecting force acting points of the plurality of adjusters on the first plane surface in a direction orthogonal to the first plane surface and points obtained by projecting force acting points of the plurality of adjusters on the second plane surface in a direction orthogonal to the second plane surface, the force acting points are set so that, among a first ray in a light flux emitted from a first point on the mask and a second ray in the light flux emitted from a second point on the mask different from the first point, and respectively reflected by the first plane surface and the second plane surface:

the first ray strikes the correction points of the first plane surface but does not strike the correction points of the second plane surface; and the second ray does not strike the correction points of the first plane surface but strikes the correction points of the second plane surface, and wherein the force acting points are set so that the correction points of the second plane surface are arranged at positions shifted from the correction points of the first plane surface in a translation direction.

7. An exposure apparatus for exposing a substrate while scanning a mask and the substrate, the exposure apparatus comprising:

a projection optical system including:
a first concave surface;
a convex surface;
a second concave surface; and
a plurality of adjusters configured to apply a force to a rear surface of each of the first concave surface and the second concave surface to adjust a shape of each of the first concave surface and the second concave surface, wherein the projection optical system is configured to:
project a pattern of the mask onto the substrate; and
cause light transmitted through the pattern of the mask to be reflected by the first concave surface, the convex surface, and the second concave surface, in this order, wherein the plurality of adjusters are arranged so that force acting points of the plurality of adjusters on the first concave surface and the second concave surface are non-axisymmetric with respect to a horizontal line orthogonal to an optical axis of the convex surface, and wherein the force acting points are set so that the correction points of the second concave surface are arranged at at least one of:

positions shifted from the correction points of the first concave surface in a radial direction centered on the optical axis; or positions shifted from the correction points of the first concave surface in a circumferential direction centered on the optical axis.

8. An exposure apparatus for exposing a substrate while scanning a mask and the substrate, the exposure apparatus comprising:

a projection optical system including:
a first plane surface;
a first concave surface;
a convex surface;
a second concave surface;
a second plane surface; and
a plurality of adjuster configured to apply a force to a rear surface of each of the first plane and the second plane surface to adjust a shape of each of the first plane surface and the second plane surface, wherein the projection optical system is configured to:
project a pattern of the mask onto the substrate; and
cause light transmitted through the pattern of the mask to be reflected by the first plane surface, the first concave surface, the convex surface, the second concave surface, and the second plane surface, in this order, and wherein the plurality of adjusters are arranged so that force acting points of the plurality of adjusters on the first plane surface and the second plane surface are non-axisymmetric with respect to a horizontal line orthogonal to an optical axis of the convex surface, and wherein the force acting points are set so that the correction points of the second plane surface are arranged at positions shifted from the correction points of the first plane surface in a translation direction.

9. An article manufacturing method comprising:
exposing a substrate using an exposure apparatus for exposing the substrate while scanning a mask and the substrate; and
developing the exposed substrate,
wherein an article is manufactured from the developed substrate, and
wherein the exposure apparatus comprises:
a projection optical system including:
- a first plane surface;
- a first concave surface;
- a convex surface;
- a second concave surface;
- a second plane surface; and
- a plurality of adjusters configured to adjust a shape of each of the first concave surface and the second concave surface by applying a force to a rear surface of each of the first concave surface and the second concave surface, wherein the projection optical system is configured to:
project a pattern of the mask onto the substrate; and
cause light transmitted through the pattern of the mask to be reflected by the first plane surface, the first concave surface, the convex surface, the second concave surface, and the second plane surface, in this order, wherein, in a state where corrections points are obtained by projecting force acting points of the plurality of adjusters on the first concave surface and the second concave surface in a direction parallel to an optical axis of the convex surface, the force acting points are set so that, among a first ray in a light flux emitted from a first point on the mask and a second ray in the light flux emitted from a second point on the mask different from the first point, and respectively reflected by the first concave surface and the second concave surface:
the first ray strikes the correction points of the first concave surface but does not strike the correction points of the second concave surface; and
the second ray does not strike the correction points of the first concave surface but strikes the correction points of the second concave surface, and
wherein the force acting points are set so that the correction points of the second concave surface are arranged at one of:
positions shifted from the correction points of the first concave surface in a radial direction centered on the optical axis; or
positions shifted from the correction points of the first concave surface in a circumferential direction centered on the optical axis.

* * * * *